(12) United States Patent
Yamamoto et al.

(10) Patent No.: US 9,082,345 B2
(45) Date of Patent: Jul. 14, 2015

(54) DISPLAY DEVICE WITH REDUCED EFFECTS FROM PIXEL SHORTS

(75) Inventors: Tetsuro Yamamoto, Kanagawa (JP); Katsuhide Uchino, Kanagawa (JP)

(73) Assignee: JOLED INC., Tokyo (JP)

( * ) Notice: Subject to any disclaimer, the term of this patent is extended or adjusted under 35 U.S.C. 154(b) by 299 days.

(21) Appl. No.: 12/920,408

(22) PCT Filed: Mar. 5, 2009

(86) PCT No.: PCT/JP2009/054217
§ 371 (c)(1),
(2), (4) Date: Dec. 6, 2010

(87) PCT Pub. No.: WO2009/113448
PCT Pub. Date: Sep. 17, 2009

(65) Prior Publication Data
US 2011/0074838 A1 Mar. 31, 2011

(30) Foreign Application Priority Data
Mar. 11, 2008 (JP) .................. 2008-060738

(51) Int. Cl.
*G09G 3/30* (2006.01)
*G09G 3/32* (2006.01)
*H01L 27/32* (2006.01)

(52) U.S. Cl.
CPC ...... *G09G 3/3233* (2013.01); *G09G 2300/0452* (2013.01); *G09G 2320/043* (2013.01); *H01L 27/3211* (2013.01); *H01L 27/3244* (2013.01)

(58) Field of Classification Search
CPC ............ G09G 3/3208; G09G 2300/04; G09G 2300/0439; G09G 2300/0443
USPC .................. 345/690, 76–83; 315/167–169.3; 408/690
See application file for complete search history.

(56) References Cited

U.S. PATENT DOCUMENTS

| 6,229,506 B1 * | 5/2001 | Dawson et al. ................ 345/82 |
| 6,476,783 B2 * | 11/2002 | Matthies et al. ............... 345/82 |
| 6,512,270 B2 * | 1/2003 | Satou et al. ................... 257/347 |

(Continued)

FOREIGN PATENT DOCUMENTS

| CN | 1998041 | 7/2007 |
| JP | 2005-101008 | 4/2005 |

(Continued)

OTHER PUBLICATIONS

International Search Report dated Apr. 21, 2009.

(Continued)

*Primary Examiner* — Dorothy Harris
(74) *Attorney, Agent, or Firm* — Dentons US LLP

(57) ABSTRACT

A display device according to the present invention includes pixel units. Each of the pixel units is made up of N consecutive pixels. One of N (N≥3) colors including R (red), G (green) and B (blue) is assigned to each of the N pixels. Each of the N pixels includes a sampling transistor Ms, drive transistor Md, holding capacitor Cs and light-emitting element (organic light-emitting diode OLED). Of the N pixels, a specific color pixel that is susceptible to a dark dot (e.g., B) or that has the highest relative luminosity factor (e.g., G) has more sets of pixel circuit elements including the drive transistor Md, holding capacitor Cs and organic light-emitting diode OLED than other color pixels and has two or more sets thereof.

22 Claims, 16 Drawing Sheets

(56) References Cited

U.S. PATENT DOCUMENTS

| | | | |
|---|---|---|---|
| 6,771,028 B1* | 8/2004 | Winters | 315/169.1 |
| 2003/0001828 A1* | 1/2003 | Asano | 345/204 |
| 2004/0070332 A1* | 4/2004 | Miller et al. | 313/498 |
| 2004/0222746 A1* | 11/2004 | Winters | 315/167 |
| 2004/0233140 A1* | 11/2004 | Jo | 345/76 |
| 2005/0173700 A1* | 8/2005 | Liao et al. | 257/40 |
| 2005/0186330 A1* | 8/2005 | Kim et al. | 427/66 |
| 2005/0199878 A1* | 9/2005 | Arao et al. | 257/66 |
| 2005/0270444 A1 | 12/2005 | Miller | |
| 2006/0170628 A1 | 8/2006 | Yamashita et al. | |
| 2006/0290277 A1 | 12/2006 | Takahashi et al. | |
| 2007/0024183 A1* | 2/2007 | Lih et al. | 313/504 |
| 2007/0063192 A1* | 3/2007 | Peng | 257/40 |
| 2007/0108443 A1* | 5/2007 | Kim | 257/40 |
| 2007/0210720 A1* | 9/2007 | Kimura | 315/169.3 |
| 2008/0018239 A1* | 1/2008 | Matsuda et al. | 313/504 |
| 2008/0030440 A1 | 2/2008 | Uchino et al. | |

FOREIGN PATENT DOCUMENTS

| | | |
|---|---|---|
| JP | 2005 101008 | 4/2005 |
| JP | 2006-215213 | 8/2006 |
| JP | 2006-330469 | 12/2006 |
| JP | 2006 330469 | 12/2006 |
| JP | 2008-026466 | 2/2008 |
| JP | 2008 026466 | 2/2008 |
| JP | 2008-027722 | 2/2008 |
| JP | 2008 027722 | 7/2008 |

OTHER PUBLICATIONS

Sony Corporation; Japanese Application No. 2008-060738; Office action dated Mar. 8, 2011; 3 pages.

Chinese Office Action issued in connection with related Chinese Patent Application No. 200980107519.7 dated Jul. 9, 2013.

* cited by examiner

FIG. 9
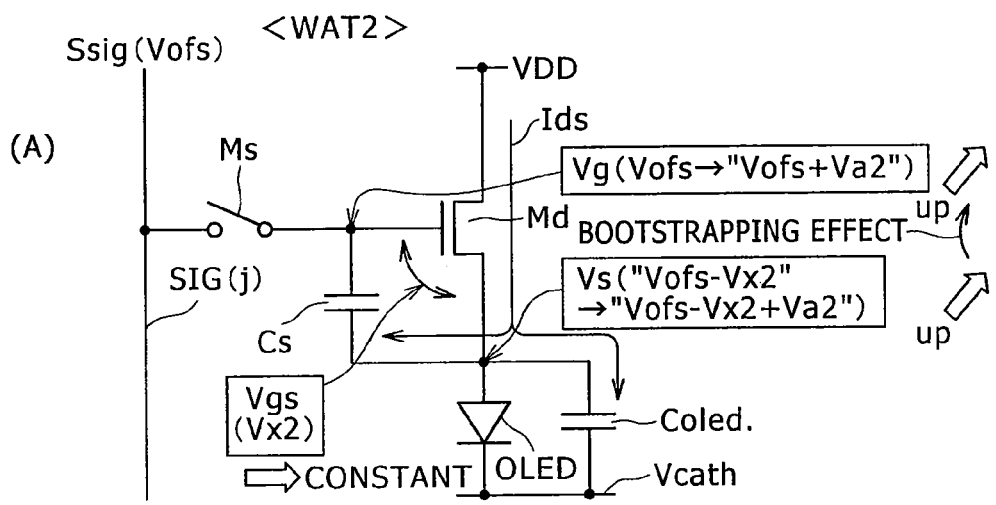
(A)
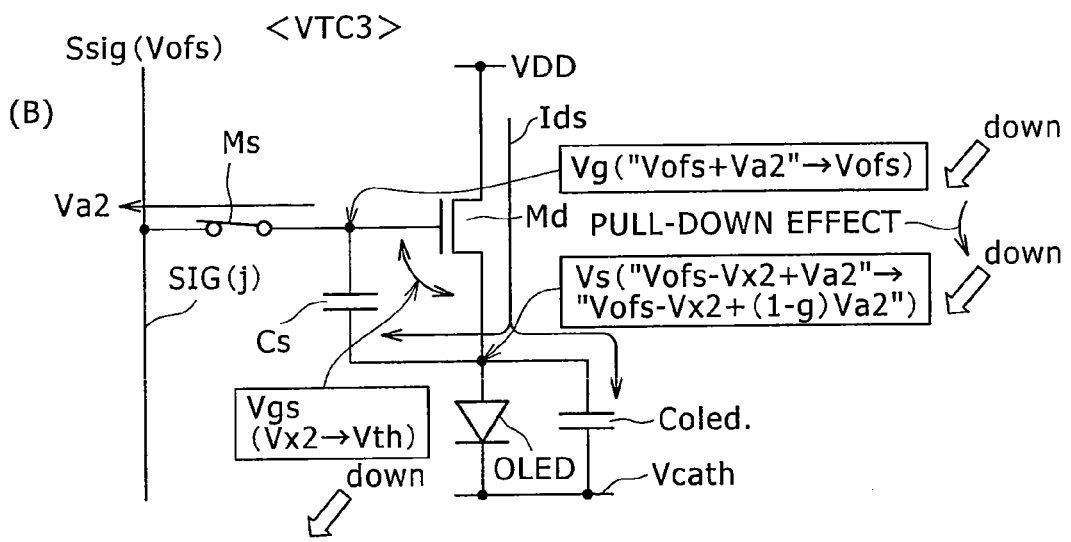
(B)

FIG.14
(A)
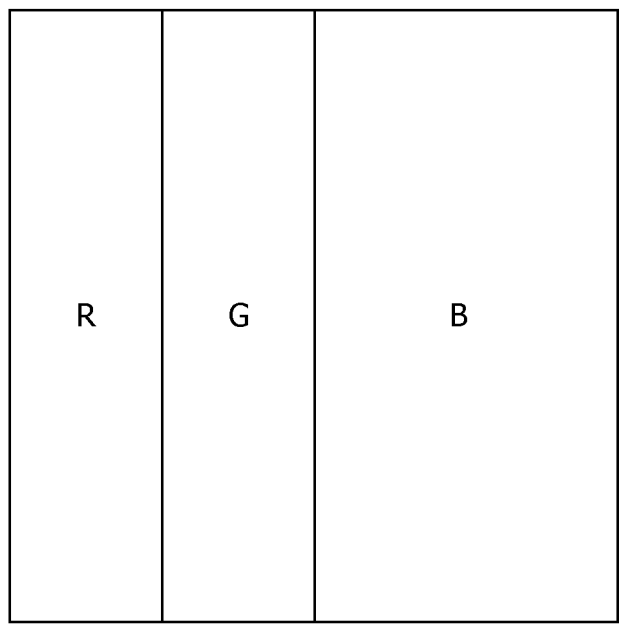
(B)
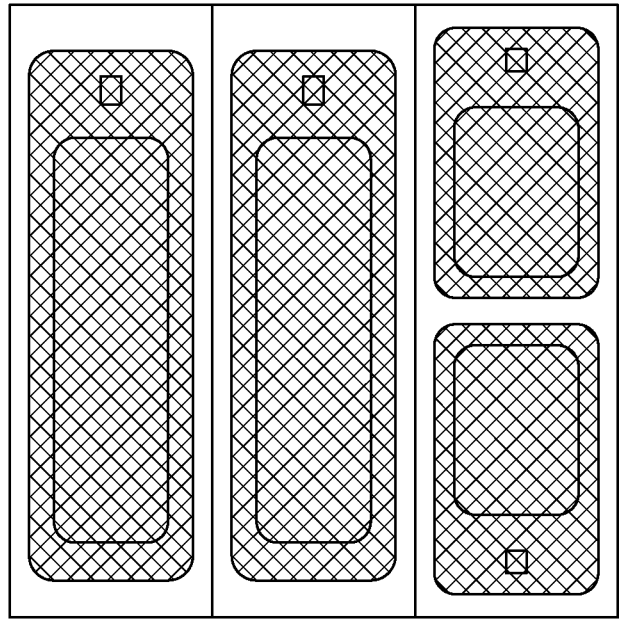

FIG. 16
(A)
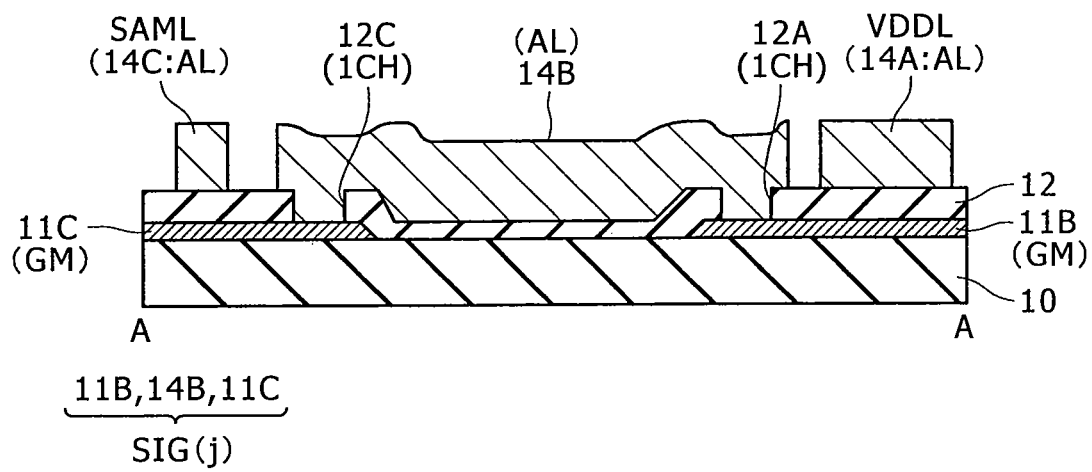
(B)
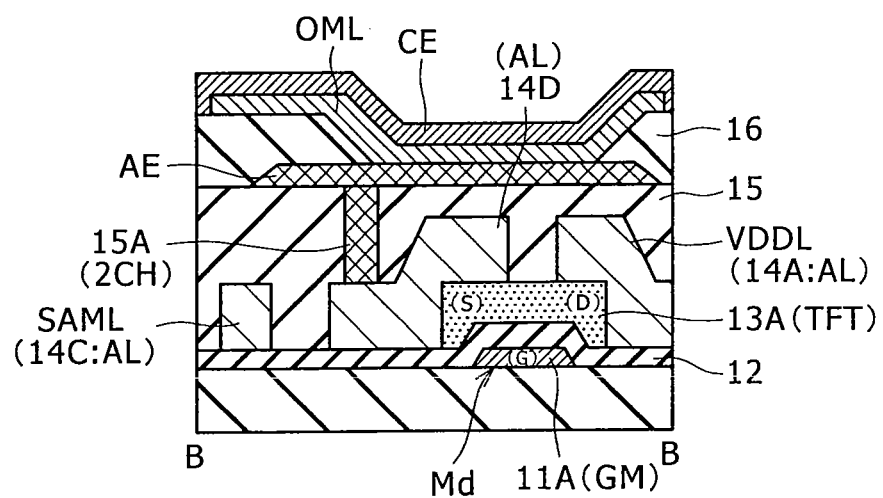

DISPLAY DEVICE WITH REDUCED EFFECTS FROM PIXEL SHORTS

TECHNICAL FIELD

The present invention relates to a display device having a pixel array formed by regularly arranging a plurality of pixel units, each of which is adapted to display a single color and made up of N consecutive pixels of three or more colors. The present invention relates more particularly to a display device having, in each pixel, a pixel circuit formed by integrating a self-luminous light-emitting element adapted to emit light of a predetermined characteristic color by itself and part of a drive circuit of the same.

BACKGROUND ART

Some display devices use electro-optical elements whose brightness changes with change in voltage applied thereto or current flowing therethrough. For example, a liquid crystal display element is a typical example of an electro-optical element whose brightness changes with change in voltage applied thereto. An organic electro-luminescence element is a typical example of an electro-optical element whose brightness changes with change in current flowing therethrough. An organic electro-luminescence element is commonly called an OLED (Organic Light Emitting Diode). A liquid crystal display element is an optical modulation element (i.e., non-self-luminous) adapted to modulate light from the light source. An OLED differs from a liquid crystal display element in that the former is a self-luminous element which can emit light by itself.

An OLED includes a plurality of organic thin films stacked one on top of another between upper and lower electrodes. These organic films serve as organic hole transporting layer and organic light-emitting layer. These films are generally thin although they vary in thickness according to the wavelength of emitted light and also for reasons including providing light enhancement effect. These films are difficult to form because they are made of organic materials. An OLED is an electro-optical element that takes advantage of light emission as a result of application of an electric field to the organic thin films. A color gray level is obtained by controlling the current value flowing through the OLED. In a display device using OLEDs as electro-optical elements, therefore, a pixel circuit is provided for each pixel that includes a drive transistor adapted to control the amount of current flowing through the OLED.

A variety of pixel circuits have been proposed. Chief among the known circuit types are four-transistor (4T) one-capacitor (1C), 4T-2C, 5T-1C and 3T-1C circuits.

All these circuits prevent image degradation caused by characteristic variation of the transistors formed by TFTs (Thin Film Transistors) and are intended to maintain a drive current constant in the pixel circuit, thus providing improved uniformity in brightness over the entire screen. In particular, when the OLED is connected to power in the pixel circuit, the characteristic variation of the drive transistor adapted to control the amount of current according to a data potential of the input video signal directly affects the emission brightness of the OLED. Therefore, the characteristic of the drive transistor, i.e., the threshold voltage, must be corrected.

Further, assuming that the threshold voltage is corrected, correcting the driving capability component (generally referred to as mobility) obtained by subtracting the components causing variation in threshold from the current driving capability of the drive transistor provides even higher uniformity.

The correction of the threshold voltage and mobility of the drive transistor is described in detail, for example, in Patent Document 1.

Patent Document 1: Japanese Patent Laid-Open No. 2006-215213

DISCLOSURE OF INVENTION

However, panels are susceptible to display defects such as dark dots in which light emitting isn't performed normally caused by dust attached to OLEDs and other electro-optical elements during manufacture. These display defects are detrimental to providing improved yield of the display device, hampering the cost reduction thereof.

In the case of OLED in particular, dust is often produced when organic thin films are stacked in a number of layers to form a multi-layered film structure. Organic thin films adhere to the inside of the deposition device and readily peel off, floating in the chamber of the deposition device. If the electrodes of the OLED are shorted to a given resistance as a result of adherence of such dust, a dark dot defect readily occurs in which the dot remains unlit at all times.

In the event of a dark dot defect, on the other hand, the extent to which the defect is visually perceived as a defect varies depending on in which color pixel of the pixel unit adapted to display color the dark dot defect occurs. That is, the more the color is visually perceived, the more degraded the display quality becomes by the pixel defect.

It should be noted that the present inventor has applied for a patent for a display device having pixels configured to suppress the impact of a dark dot defect (Japanese Patent Application No. 2007-307861).

It is an object of the present invention to propose a pixel circuit configuration that can more effectively suppress the impact of a dark dot defect on the screen display when the dark dot defect occurs while at the same time suppressing the increase in pixel area than the above display device for which a patent has been applied.

A display device according to an embodiment of the present invention (first embodiment) includes a pixel array. The pixel array includes a plurality of regularly arranged pixel units. Each of the pixel units is made up of N consecutive pixels. One of N (N≥3) colors including R (red), G (green) and B (blue) is assigned to each of the N pixels.

Each of the N pixels constituting the pixel unit includes a sampling transistor, drive transistor, holding capacitor and light-emitting element.

The holding capacitor is coupled to a light emission control node of the drive transistor to hold a data voltage fed via the sampling transistor.

The light-emitting element is connected in series to a drive current path together with the drive transistor. The same element emits light of a characteristic color determined for each pixel by itself according to the held data voltage based on the drive current controlled by the drive transistor.

On the other hand, of the N pixels, a specific color pixel that is susceptible to a dark dot or that has the highest relative luminosity factor has more sets of pixel circuit elements including the drive transistor, holding capacitor and light-emitting element than other color pixels and has two or more sets thereof.

In addition to the features of the first embodiment, a display device according to another embodiment of the present invention (second embodiment) is further configured so that the light-emitting element has a multi-layered film structure. The multi-layered film structure is formed by stacking, on one of an anode and cathode, a plurality of organic thin films of materials and thicknesses suitable for emitting light of an intended color and the other of the anode and cathode. The total thickness of the plurality of organic thin films formed in the specific color pixel that is susceptible to a dark dot is smaller than the total film thickness of the other color pixels.

More preferably in the present embodiment, the smaller the total thickness of the plurality of organic thin films, the more sets there are in the other color pixels, so long as the other color pixels have fewer sets of pixel circuit elements than the specific color pixel (third embodiment).

In addition to the features of the first embodiment, a display device according to still another embodiment of the present invention (fourth embodiment) is further configured so that the specific color pixel having the highest relative luminosity factor is the green (G) pixel and that each of the R (red) and B (blue) pixels has fewer sets that the green (G) pixel.

In addition to the features of the first embodiment, a display device according to still another embodiment of the present invention (fifth embodiment) is further configured so that if there are the plurality of sets in one of the pixels, the single sampling transistor is provided to be shared among the plurality of sets.

In addition to the features of the first embodiment, a display device according to still another embodiment of the present invention (sixth embodiment) is further configured so that the drive transistors are designed to have the same channel conductivity type and size, and the holding capacitors designed to have the same capacitance in all the sets provided in the N pixels. Moreover, if the plurality of light-emitting elements are provided in the same pixel, the drive current paths of the plurality of light-emitting elements are connected in parallel to a drive voltage supply terminal for separation between the light-emitting elements.

In addition to the features of the first embodiment, a display device according to still another embodiment of the present invention (seventh embodiment) is further configured so that the specific color pixel is larger in area than the other color pixels. In order to do so, the total area of openings of the light-emitting elements, provided as many as the number of sets in the specific color pixel, is approximately equal to the opening area per pixel of the other color pixels.

More preferably, if the other color pixels differ in number of sets, the pixels differ in area so that the opening area per pixel is approximately the same between the pixels (eighth embodiment).

According to the above configurations, of the N pixels making up a pixel unit adapted to display a color, a specific color pixel has more sets of pixel circuit elements including the drive transistor, holding capacitor and light-emitting element than other color pixels and has two or more sets thereof.

Here, the term "specific color pixel" refers to a pixel that is susceptible to a dark dot such as the blue (B) pixel in which the multi-layered organic thin film of the light-emitting element is the thinnest of all pixels. Alternatively, the term "specific color pixel" refers to a pixel such as the green (G) pixel having the highest relative luminosity factor.

The action of the display device according to the present invention will be described by citing an example for improvement of understandability. We assume here that, in a pixel unit including three pixels (R, G and B) (N=3), the blue (B) pixel has, for example, two sets of pixel circuit elements, and that the other color pixels each have one set thereof.

In this example, one pixel unit has four sets and four light-emitting elements. Assuming that the four light-emitting elements are identical in opening area, the probability of each of the same elements developing a dark dot defect in the event of such a defect is ¼ which is the same for all the light-emitting elements. It should be noted, however, that the probability of the specific color pixel (B) developing a dark dot is twice as high as the other color pixels on the precondition that the opening area is the same between the specific color pixel (B) and other color pixels (R and G) because there is one more opening in the specific color pixel (B).

As for the colors, on the other hand, if the pixel (R or G) other than the specific color pixel (B) develops a dark dot defect, this color pixel (R or G) will emit absolutely no light. However, the specific color pixel (B) has two light-emitting elements. Therefore, even if one of the same elements no longer emits light, blue light continues to be emitted thanks to one additional light-emitting element although the brightness is halved.

On the other hand, when the opening area is the same between the red, green and blue (R, G and B) pixels, the probability of developing a dark dot is the same for all color pixels thanks to two openings provided for the specific color pixel (B). The area of each of the openings of the specific color pixel (B) is half area of each of the other color (R, G) pixels. Moreover, as described above, even if one of the light-emitting elements of the specific color pixel (B) develops a dark dot due, for example, to dust, the other of the light-emitting elements emits light, so the worst case of no blue light emission can be avoided.

When the specific color pixel has three sets or more, the more sets there are, the less affected the specific color pixel is by failure such as dust of one of the light-emitting elements to emit light. That is, if the specific color pixel has three sets, the brightness will be ⅔. As a result, the specific color pixel is less affected by a dark dot than if the brightness is ½. Similarly, if the specific color pixel has four or more sets, the brightness will be ¾, ⅘, ⅚ and so on. As a result, the more sets there are, the less affected the specific color pixel is by a dark dot. It should be noted, however, that an attempt to provide a number of openings of the light-emitting elements in the same area leads to a smaller area of each opening, thus resulting in reduced initially set brightness (brightness with no dark dots). In general, therefore, the more sets there are, the greater the color pixel area with more sets tends to be.

As described above, the number of sets is generally determined for each color in consideration of a tradeoff between increased pixel area and suppression of the impact of dark dot defect (extent to which the brightness drops).

Application of the present invention under this circumstance provides more sets in the specific color pixel that is susceptible to a dark dot or that has high relative luminosity factor rather than providing the same number of sets, thus easing the tradeoff.

The present invention makes it possible to propose a pixel circuit configuration that can more effectively suppress the impact of dark dot defect on the screen display while at the same time suppressing the increase in pixel area by easing the tradeoff.

BRIEF DESCRIPTION OF DRAWINGS

FIG. 9 is a diagram describing the operation until a third threshold correction;

FIG. 14 is a plan view illustrating examples with different layouts of pixel circuit elements according to the embodiment of the present invention;

FIG. 16 is a sectional view of the pixel circuit according to the embodiment of the present invention.

BEST MODE FOR CARRYING OUT THE INVENTION

Embodiments of the present invention will be described below with reference to the accompanying drawings taking, as an example, a case in which the present invention is applied to an organic EL display device.

<Overall Configuration>

Figure 1:
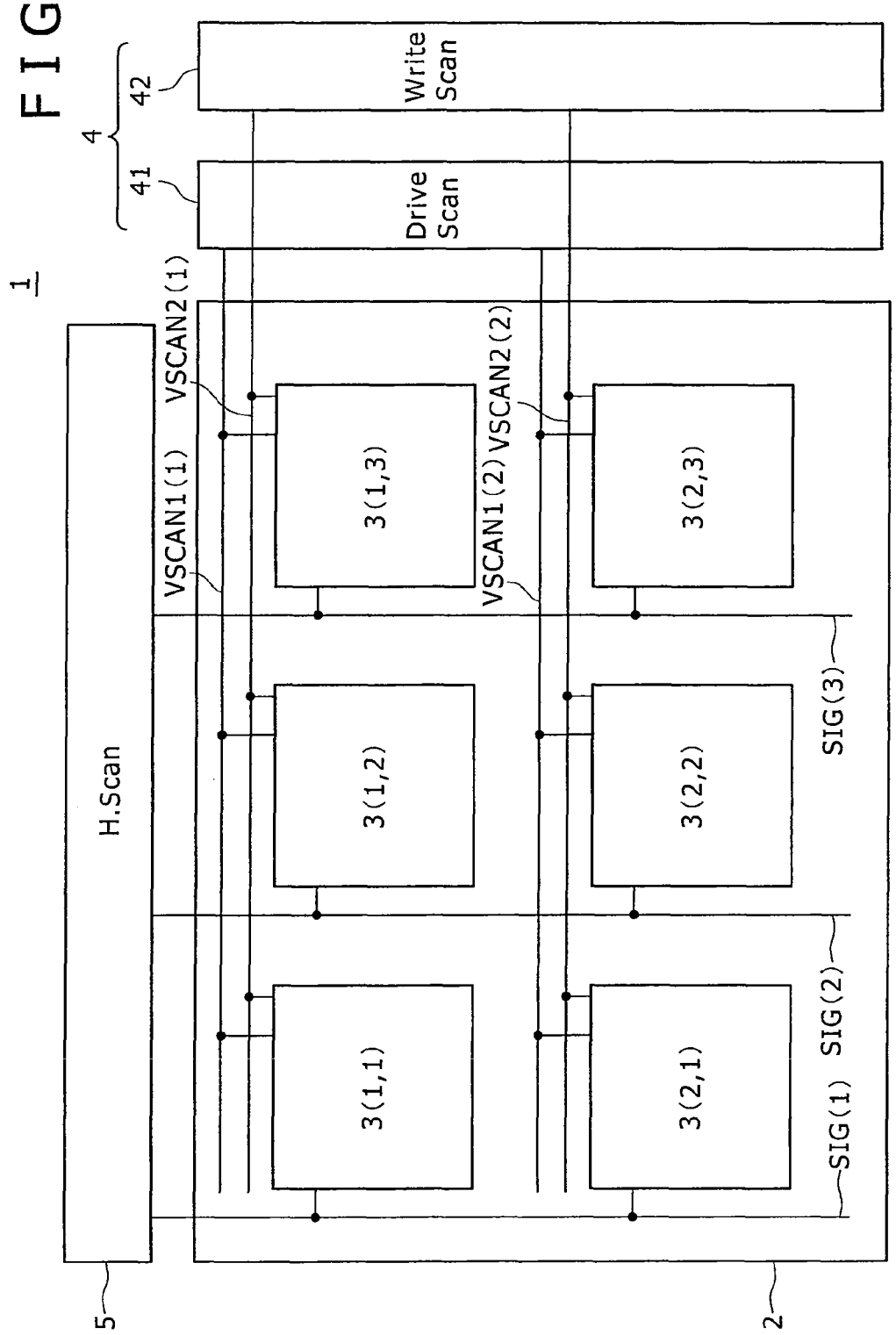
FIG. 1 is a diagram illustrating the major components of an organic EL display device according to an embodiment of the present invention.

FIG. 1 is a diagram illustrating the major components of an organic EL display device according to an embodiment of the present invention.

An organic EL display device 1 illustrated in FIG. 1 includes a pixel array 2 and drive circuit. The pixel array 2 has a plurality of pixel circuits 3 $(i,j)$ arranged in a matrix form. The drive circuit drives the pixel array 2 and includes a vertical drive circuit (V scanner) 4 and horizontal drive circuit (H scanner or H. Scan).

The plurality of V scanners 4 are provided depending on the configuration of the pixel circuits 3. Here, the V scanner 4 includes a horizontal pixel line drive circuit (DSCN) 41 and write signal scan circuit (WSCN) 42.

Reference symbol 3 $(i,j)$ of the pixel circuits shown in FIG. 1 denotes that each pixel circuit has a vertical address i (i=1 or 2) and horizontal address j (j=1, 2 or 3). Each of these addresses i and j take on an integer equal to or greater than 1. The maximum values of these address i and j are "n" and "m," respectively. Here, for simplification of the diagram, a case will be shown in which n=2 and m=3.

This address notation is similarly applied to the elements, signals, signal lines, voltages and others of the pixel circuits in the description and drawings which follow.

Pixel circuits 3(1,1) and 3(2,1) are connected to a common vertical first signal line SIG(1). Similarly, pixel circuits 3(1,2) and 3(2,2) are connected to a common vertical second signal line SIG(2). Still similarly, pixel circuits 3(1,3) and 3(2,3) are connected to a common vertical third signal line SIG(2).

A first scan signal VSCAN1(1) can be applied to the pixel circuits 3(1,1), 3(1,2) and 3(1,3) in the first row from the horizontal pixel line drive circuit 41 via a common scan signal line. Similarly, a first scan signal VSCAN1(2) can be applied to the pixel circuits 3(2,1), 3(2,2) and 3(2,3) in the second row from the horizontal pixel line drive circuit 41 via a common scan signal line.

Further, a second scan signal VSCAN2(1) can be applied to the pixel circuits 3(1,1), 3(1,2) and 3(1,3) in the first row from the write signal scan circuit 42 via other common scan signal line. Similarly, a second scan signal VSCAN2(2) can be applied to the pixel circuits 3(2,1), 3(2,2) and 3(2,3) in the second row from the write signal scan circuit 42 via other common scan signal line.

<Pixel Circuit 1>

Figure 2:
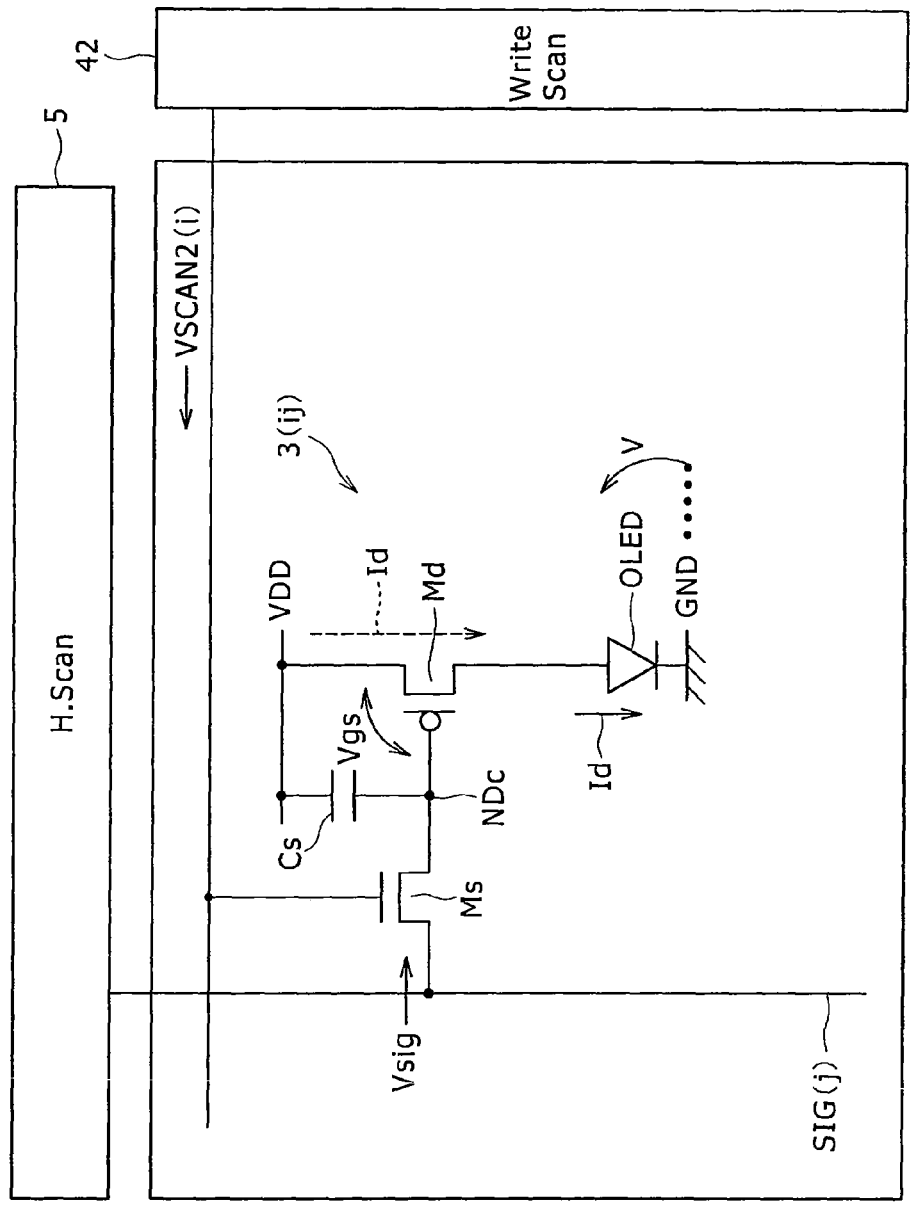
FIG. 2 is a basic configuration diagram of a pixel circuit 1 according to the embodiment of the present invention.

FIG. 2 illustrates the most basic configuration of the pixel circuit 3$(i,j)$ when the drive transistor includes a PMOS transistor.

The pixel circuit 3$(i,j)$ illustrated in FIG. 2 controls an organic light-emitting diode OLED serving as a light-emitting element. The pixel circuit includes a drive transistor Md, sampling transistor Ms and a holding capacitor Cs, in addition to the organic light-emitting diode OLED. The drive transistor Md includes a PMOS TFT. The sampling transistor Ms includes an NMOS TFT.

Although not specifically illustrated, the organic light-emitting diode OLED has a layered body with a second electrode (cathode electrode) formed thereon. The layered body makes up an organic film. This layered body is formed by sequentially depositing, on a substrate made, for example, of transparent glass or the like, a first electrode (anode electrode), hole transporting layer, light-emitting layer, electron transporting layer, electron injection layer and other layers. The anode electrode is connected to a positive first power source, and the cathode electrode to a negative second power source. It should be noted that the second power source may be positive, and the first power source negative. In this case, the anode electrode is connected to the second power source, and the cathode electrode to the first power source.

It should be noted that FIG. 2 illustrates a case in which the anode of the organic light-emitting diode OLED is supplied with a high potential Vcc_H from the positive first power source, and that the cathode of the organic light-emitting diode OLED is connected to a reference voltage such as ground voltage GND.

When a predetermined bias voltage is applied between the cathode and anode of the organic light-emitting diode OLED, the injected electrons and holes recombine in the light-emitting layer, thus emitting light. Because the organic light-emitting diode OLED can emit any of red (R), green (G) and blue (B) lights by proper selection of the organic material making up the organic film, the same diode OLED is capable of displaying a color image, for example, if the pixels are arranged in each row in such a manner that R, G and B lights are able to be emitted. Alternatively, a white light-emitting organic material may be used, with the distinction between R, G and B made using filter colors. Still alternatively, four colors, namely, R, G, B and W (white), may be used instead.

The drive transistor Md functions as current control means adapted to control the amount of current flowing through the light-emitting element (organic light-emitting diode OLED) so as to determine the display gray level.

The drive transistor Md has its source connected to the supply line of the high potential Vcc_H and its drain connected to the anode of the organic light-emitting diode OLED.

The sampling transistor Ms is connected between a supply line (video signal line DTL(j)) of a data potential Vsig and the gate of the drive transistor Md. The data potential Vsig determines the pixel gray level. The same transistor Ms has one of its source and drain connected to the gate of the drive transistor Md and the other thereof connected to the video signal line DTL(j). The data potential Vsig is applied to the video signal line DTL(j) from the H scanner 5. The sampling transistor Ms samples the data having the level to be displayed by the pixel circuit at a proper timing during this data potential application period. This is done to eliminate the adverse impact of unstable level during the transition period on the display image at the beginning or the last of the data pulse having the desired data potential Vsig to be sampled.

The holding capacitor Cs is connected between the supply line of the high potential Vcc_H and the gate of the drive transistor Md. The roles of the holding capacitor Cs will be described later in relation to the operation.

It should be noted that the components controlled by the horizontal pixel line drive circuit 41 in FIG. 1 are omitted in FIG. 2. An example of such components may be, for example, another transistor connected between the supply line of the high potential Vcc_H and the drive transistor Md in FIG. 2. Alternatively, another example of such components may be that adapted to repeatedly apply the high potential Vcc_H for a predetermined time at constant intervals. Such components are provided for purposes of drive scan. However, they are omitted in FIG. 2 because of many schemes available for drive scan.

<Pixel Circuit 2>

Figure 3:
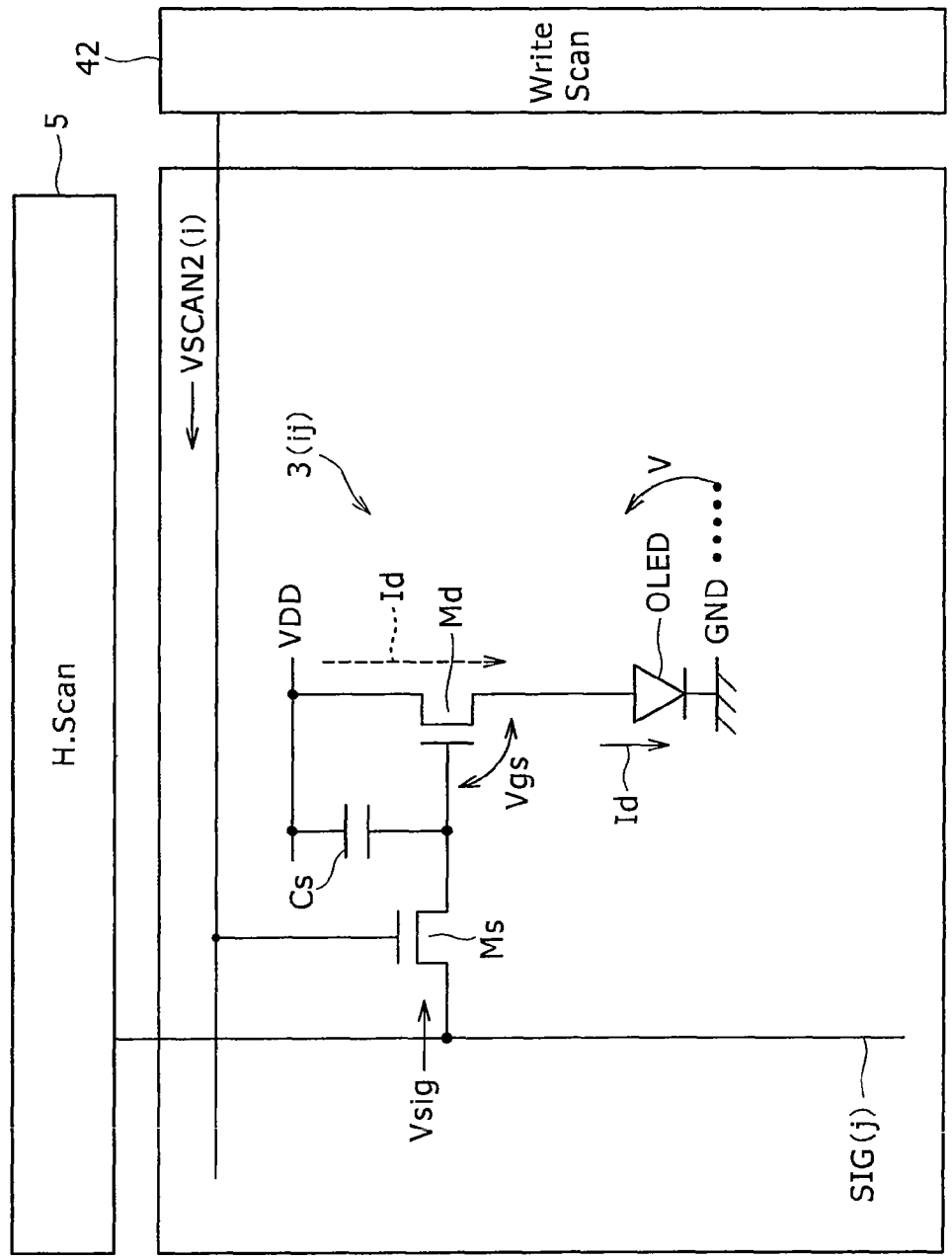
FIG. 3 is a basic configuration diagram of a pixel circuit 2 according to the embodiment of the present invention.

FIG. 3 illustrates the most basic configuration of the pixel circuit $3(i,j)$ when the drive transistor includes an NMOS transistor.

The pixel circuit $3(i,j)$ illustrated in FIG. 3 is similar to that in FIG. 2 except that the drive transistor Md is of different channel conductivity type from the one shown in FIG. 2. Using an NMOS transistor as the drive transistor Md offers two advantages. Firstly, a large drive current can be used per unit size. Secondly, N-channel transistors can be used for all the transistors in the pixel circuit, thus providing a simpler manufacturing process.

It should be noted that all transistors in the pixel circuits 1 and 2 are formed by TFTs. The thin film semiconductor layer used to form the TFTs is made of a semiconductor material such as polysilicon or amorphous silicon and the like. Polysilicon TFTs can have a high mobility but vary significantly in their characteristics, which makes these TFTs unfit for achieving a larger screen size of the display device. Therefore, amorphous TFTs are generally used in a display device having a large screen. It should be noted, however, that P-channel TFTs are difficult to form with amorphous silicon TFTs. As a result, the pixel circuit 2 or a pixel circuit based thereon should preferably be used.

Here, the above-described pixel circuits 1 and 2 are examples of a pixel circuit applicable to the present embodiment, i.e., basic examples of a two-transistor (2T) one-capacitor (1C) configuration. Therefore, the pixel circuit which can be used in the present embodiment may have an additional transistor and/or capacitor in addition to the pixel circuit 1 or 2 as a basic configuration. More specifically, the pixel circuit applicable to the present embodiment may have, for example, any of 4T-1C, 4T-2C and 5T-1C pixel circuits, though detailed description is omitted.

<Outline of Light Emission Control>

The schematic light emission control operation of the above two pixel circuits can be briefly described as follows.

The holding capacitor Cs is coupled to a control node NDc of the drive transistor Md. The signal voltage Vsig from the signal line SIG(j) is sampled by the sampling transistor Ms. The obtained data potential Vsig is applied to the control node NDc.

Figure 4:
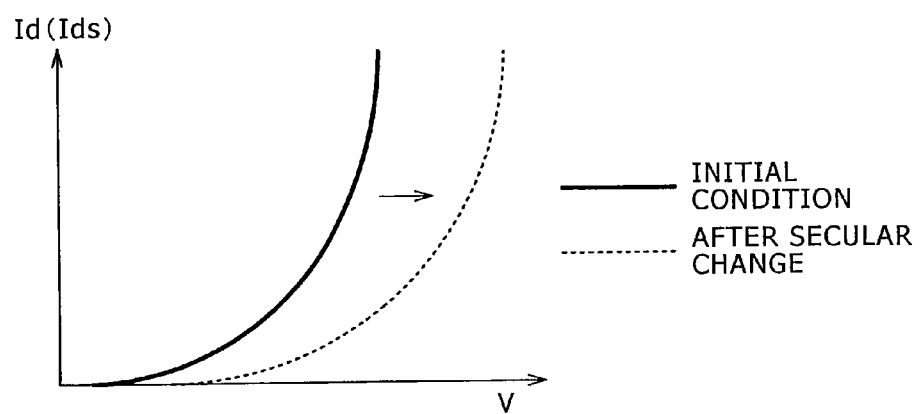
FIG. 4 is a graph and equation illustrating the characteristic of an organic light-emitting diode.

FIG. 4 illustrates the I-V characteristic graph of the organic light-emitting diode OLED and a general equation of a drain current Ids of the drive transistor Md (corresponds to a drive current Id of the OLED).

When the predetermined data potential Vsig is applied to the gate of the drive transistor Md, the P-channel drive transistor Md in the case of the pixel 1 shown in FIG. 2 is designed to operate in the saturation region at all times with its source connected to the power source. As a result, the P-channel drive transistor Md functions as a constant current source having a current level denoted by the equation shown in FIG. 4. The drain current Ids supplied by this constant current source is determined by a gate-to-source voltage Vgs whose level is commensurate with the data potential applied to the gate of the P-channel drive transistor Md. Therefore, the organic light-emitting diode OLED emits light at the brightness commensurate with the post-sampling data potential Vsig.

As is well known, the I-V characteristic of the organic light-emitting diode OLED changes as illustrated in FIG. 4 due to secular change. At this time, the constant current source attempts to supply the same level of the drive current Id. This increases a voltage V applied to the organic light-emitting diode OLED, pushing up the drain potential of the P-channel drive transistor Md. However, the gate-to-source voltage Vgs of the P-channel drive transistor Md remains constant. Therefore, the constant drive current Id flows through the organic light-emitting diode OLED. As a result, the light emission brightness remains unchanged.

In the case of the pixel 2 shown in FIG. 3 having an N-channel transistor as the drive transistor Md, the same transistor Md has its source connected to the organic light-emitting diode OLED. As a result, the gate-to-source voltage Vgs changes with change of the organic light-emitting diode OLED over time.

This changes the drive current Id flowing through the organic light-emitting diode OLED, thus changing the light emission brightness even if the data potential Vsig is at the predetermined level.

Further, a threshold voltage Vth and mobility μ of the drive transistor Md are different from one pixel circuit to another. This leads to a variation in the drain current Ids according to the equation shown in FIG. 4, thus changing the light emission brightness between different pixels even if the supplied data potential Vsig is the same.

It should be noted that, in the equation shown in FIG. 4, reference symbol Ids represents the current flowing between the drain and source of the drive transistor Md operating in the saturation region. Further, in the drive transistor Md, reference symbol Vth represents the threshold voltage, μ the mobility, W the effective channel width (effective gate width), and L the effective channel length (effective gate length) respectively. Still further, reference symbol Cox represents the unit gate capacitance of the drive transistor Md, namely, the sum of the gate oxide film capacitance per unit area and the fringing capacitance between the source (or drain) and gate.

The pixel circuit having the N-channel drive transistor Md is advantageous in that it offers high driving capability and permits simplification of the manufacturing process. To suppress the variation in the threshold voltage Vth and mobility μ, however, the following correction operations are demanded before the above-described light emission control operation.
<Outline of the Corrections>

Although a detailed control description will be given later, the gate-to-source voltage Vgs of the drive transistor Md is maintained at the level of the threshold voltage Vth by the holding capacitor Cs before the sampling. This preliminary operation is called the "threshold correction."

A post-sampling data voltage Vin is added to the gate of the drive transistor Md after the threshold correction. Therefore, the gate-to-source voltage Vgs changes to "Vth+Vin" and is maintained at this level. The drive transistor Md turns on according to the magnitude of the data voltage Vin. If the drive transistor Md does not easily turn on because of its large threshold voltage Vth, "Vth+Vin" is also large. In contrast, if the drive transistor Md easily turns on because of its small threshold voltage Vth, "Vth+Vin" is also small. This eliminates the impact of variation in the threshold voltage Vth from the drive current, thus maintaining the drain current Ids (drive current Id) constant for the constant data voltage Vin.

Further, a "mobility correction" (driving capability correction to be precise) is performed, for example, before the data sampling and after the threshold voltage correction.

The mobility correction changes the gate potential further according to the current driving capability of the drive transistor Md with the voltage "Vth+Vin" maintained constant. Although not illustrated in FIGS. 2 and 3, the drive transistor Md has a path between its gate and source or drain of the drive transistor Md. This path charges or discharges the holding capacitor with the current supplied via the current channel of the drive transistor Md. The mobility correction is performed by controlling whether or not to pass a current through this path.

Then, the organic light-emitting diode OLED emits light as it is driven by this constant current.
<Pixel Circuit 3>

Figure 5:
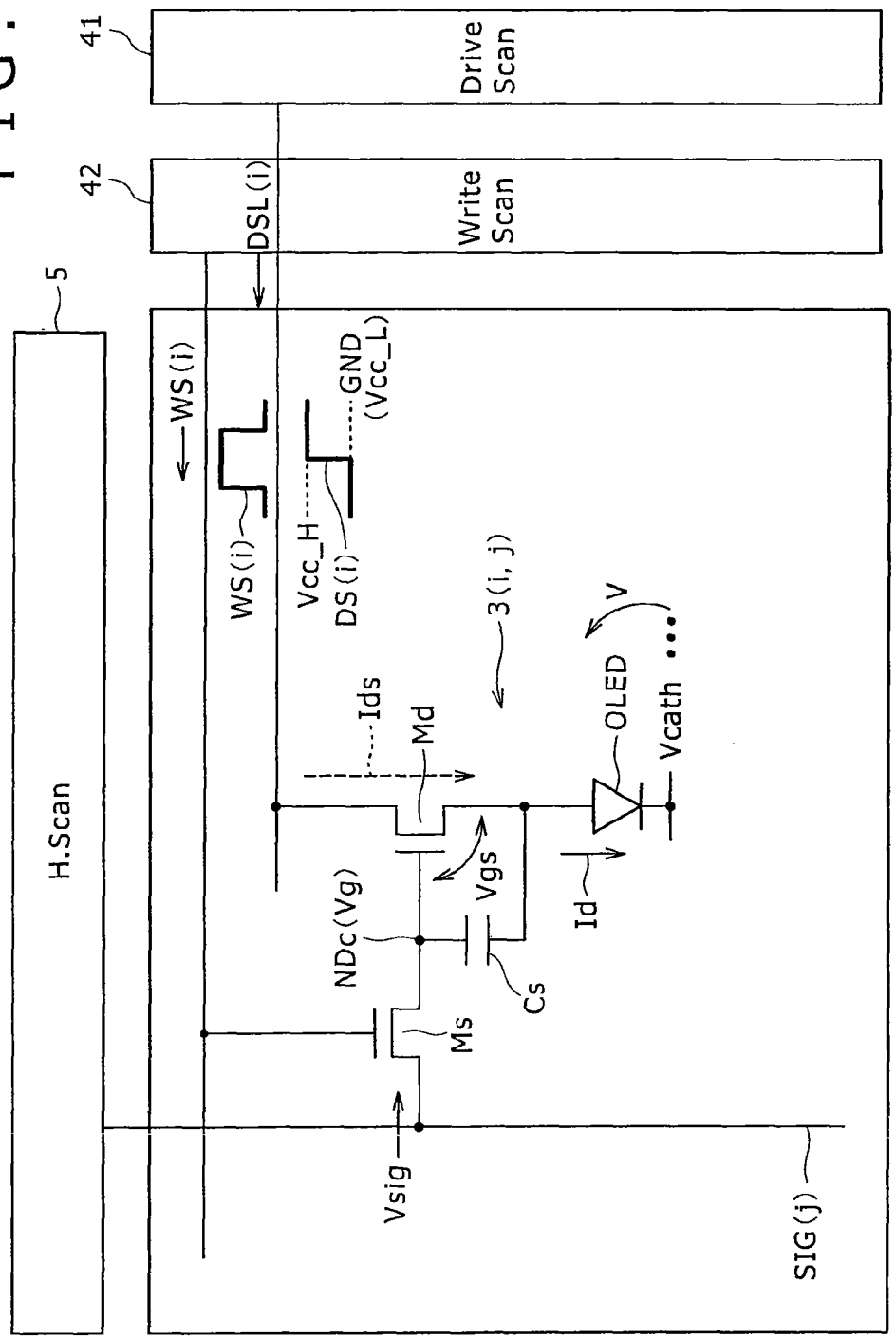
FIG. 5 is a basic configuration diagram of a pixel circuit 3 according to the embodiment of the present invention.

FIG. 5 illustrates a modification example of the pixel circuit 2 which takes into account the above charging-discharging path during the mobility correction.

In the pixel circuit shown in FIG. 5, the holding capacitor Cs is connected between the gate and source of the drive transistor Md rather than between the gate and drain of the drive transistor Md as illustrated in FIG. 3. The pixel circuit in FIG. 5 is identical to that in FIG. 3 in other configuration. It should be noted, however, that, here, power driving is achieved by driving the drain voltage of the drive transistor Md between high level (e.g., high potential Vcc_H) and low level (low-potential Vcc_L such as negative potential) using a power source drive pulse DS(i) (notation of a first scan signal VSCAN1(i) shown in FIG. 1 as a pulse). The same pulse DS(i) is supplied from the horizontal pixel line drive circuit 41. Further, a video signal Ssig (data potential Vsig) is sampled by the sampling transistor Ms using a write drive pulse WS(i) (notation of a second scan signal VSCAN2(i) shown in FIGS. 1 and 3 as a pulse). The same pulse WS(i) is supplied from the write signal scan circuit 42.

It should be noted that although the power driving of the pixel circuit 3 is not limited to that shown in FIG. 5, we assume, for convenience of concrete description given later, that the power driving method shown in FIG. 5 is used.
<Detailed Example of the Display Control>

A description will be given of the operation of the circuit shown in FIG. 5 during the data write operation together with the threshold voltage and mobility correction operations. This series of operations are referred to as the "display control."

FIGS. 6(A) to 6(F) are timing diagrams illustrating the waveforms of various signals and voltages during the display control. Here, we assume that data is written on a row-by-row basis sequentially during the display control. Therefore, the first row having the pixel circuits 3(1,j) is the write target row (display row). As a result, the second and third rows having the pixel circuits 3(2,j) and 3(3,j) are not the target rows (non-display rows) at the point in time shown in FIG. 6. Data is written to the display row through the display control shown in FIG. 6 which will be described below. Then, the display row changes to the second row which undergoes the same display control. The same display control is repeated on the third, fourth and subsequent rows, thus allowing a screen to be displayed. After a screen is displayed, the display control is repeated the demanded number of times to display other screens in the same manner.

FIG. 6(A) is a waveform diagram of the video signal Ssig.

Figure 6:
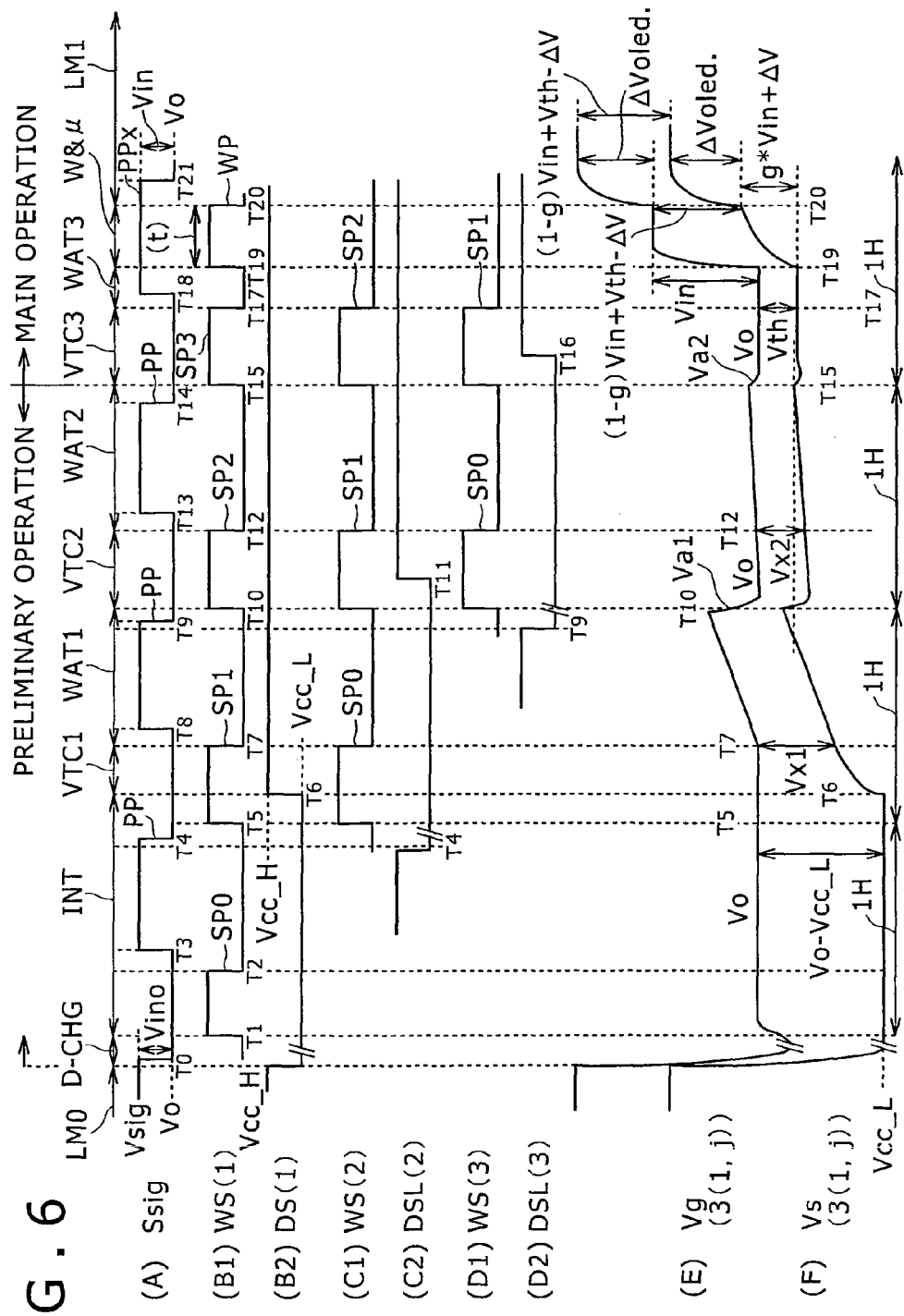
FIG. 6 is a timing diagram illustrating the waveforms of various signals and voltages during display control according to the embodiment of the present invention.
Figure 7:
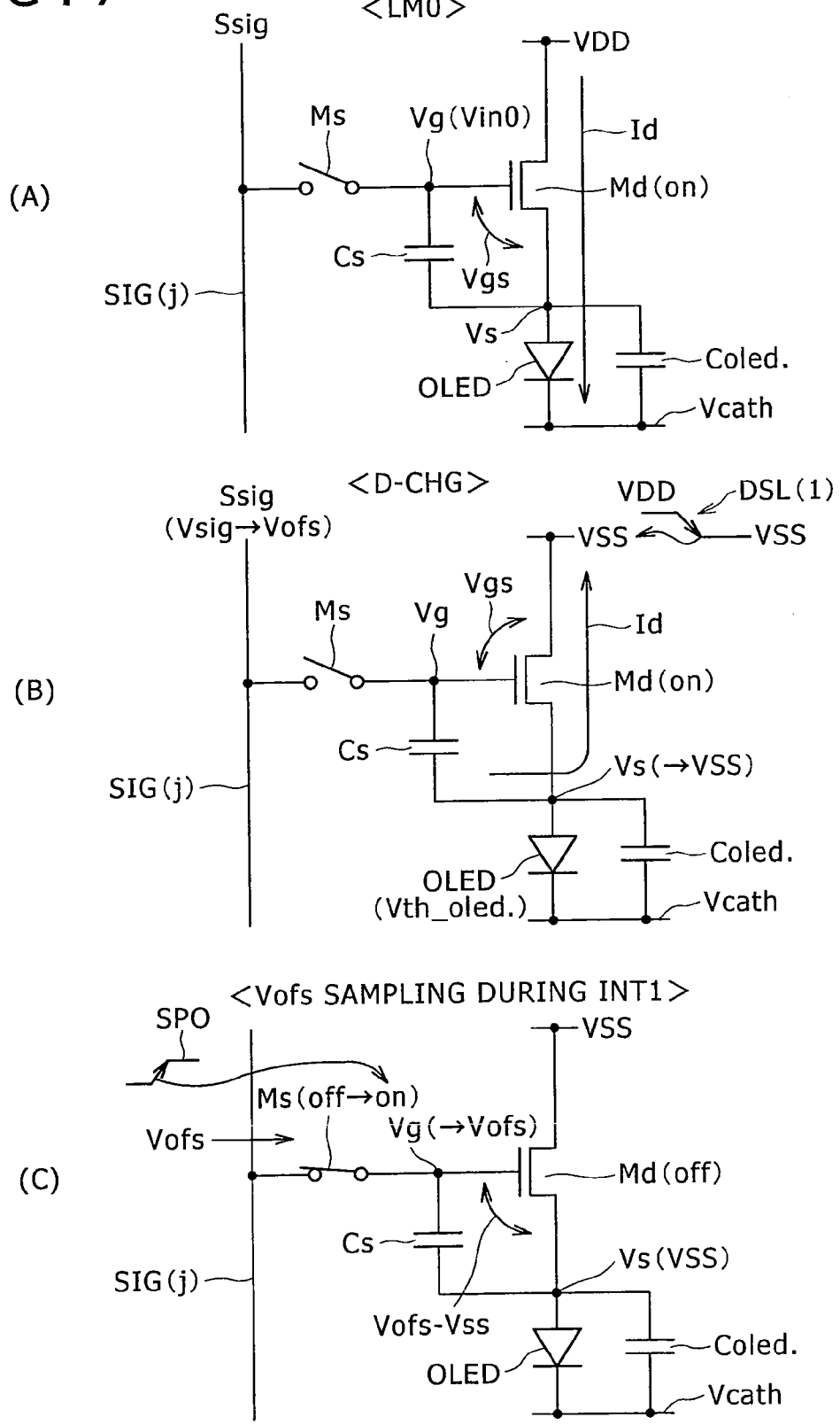
FIG. 7 is a diagram describing the operation until sampling.
Figure 8:
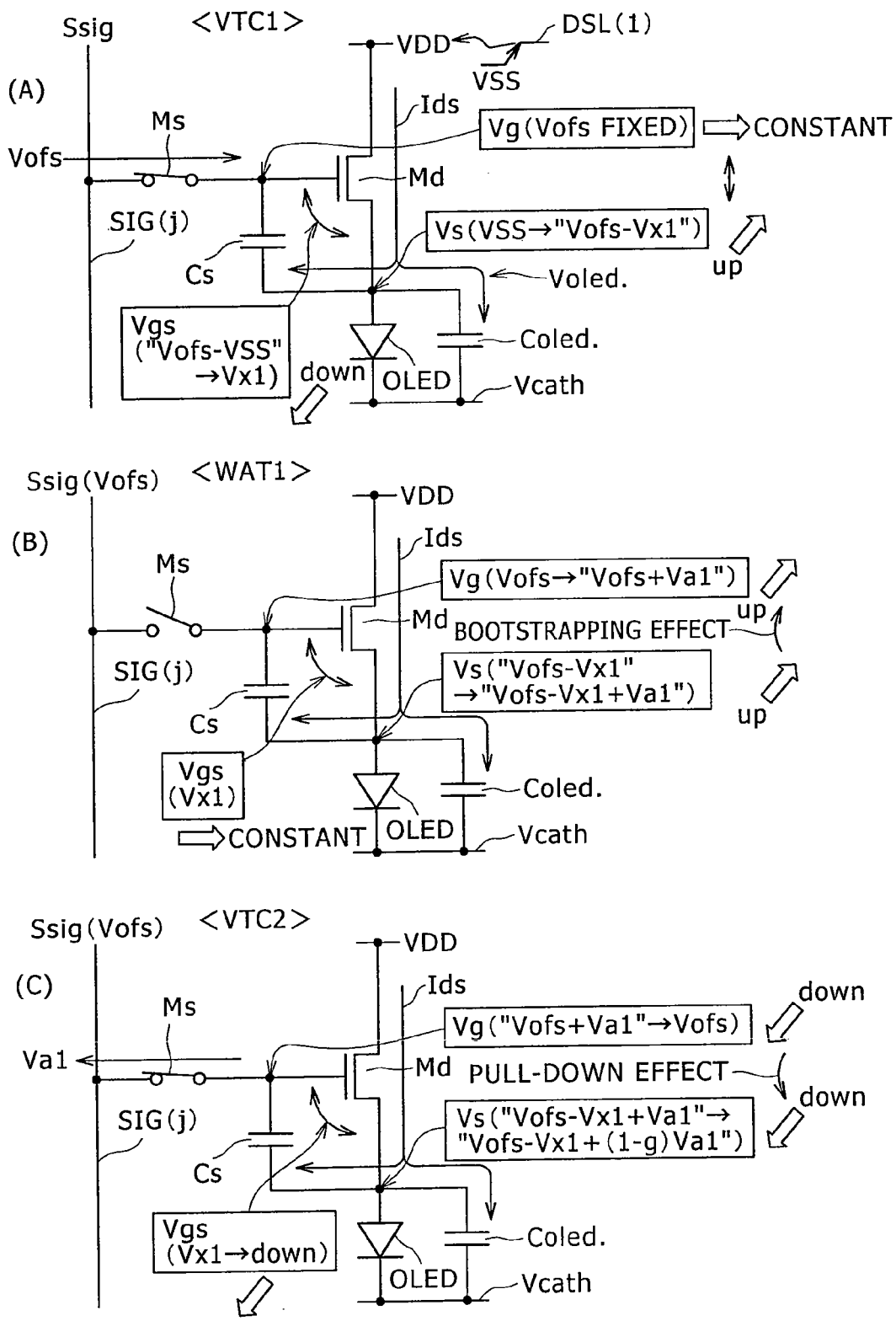
FIG. 8 is a diagram describing the operation until a second threshold correction.

FIGS. 6(B1) and 6(B2) are waveform diagrams of a write drive pulse WS(1) and power drive pulse DS(1) supplied to the first row to which data is to be written. Similarly, FIGS. 6(C1) and 6(C2) are waveform diagrams of a write drive pulse WS(2) and power drive pulse DS(2) supplied to the second row to which data is not to be written. FIGS. 6(D1) and 6(D2) are waveform diagrams of a write drive pulse WS(3) and power drive pulse DS(3) supplied to the third row to which data is not to be written.

FIG. 6(E) is a waveform diagram of the gate potential of the drive transistor Md (potential of the control node NDc) in the pixel circuit 3(1,j) in the first row to which data is to be written.

FIG. 6(F) is a waveform diagram of the source potential of the drive transistor Md (anode potential of the organic light-emitting diode OLED) in the pixel circuit 3(1,j) in the first row to which data is to be written.
[Definitions of the Periods]

As illustrated at the bottom of FIG. 6(F), FIG. 6 shows the waveform diagrams over a time span about slightly more than four times one horizontal period (1H) of the NTSC video signal standard. In the last horizontal period (1H), not only the last or third threshold correction (VTC3) but also the mobility correction and actual data write (W&μ) are performed continuously (main operation). The three horizontal periods ((1H)×3) preceding the main operation performed in the last horizontal period (1H) are spent on performing the threshold correction twice in advance so that the correction progresses to a certain extent. This is done in consideration of the fact to initialization and that the final threshold correction may be too short to correct the threshold properly (preliminary operation).

With the high resolution of the display image progressing and the display panel drive frequency already extremely high today, the display control as shown in FIG. 6 is unable to complete all operations from the threshold voltage correction to data write within a short one horizontal period (1H). Therefore, the threshold correction is performed in several steps because of the lack of time available for the threshold correction. It should be noted, however, that if one horizontal period (1H) is enough for the main operation as in small- and medium-sized display panels, one horizontal period (1H) may be enough to perform the initialization for the preliminary operation. Of course, the preliminary operation may last for two horizontal periods (2H), or more than four horizontal periods (4H).

When the main operation is conducted for a certain row, the preliminary operation can be performed in parallel for the next (and subsequent rows). Therefore, the length of the preliminary operation time hardly affects the display period as a whole. Rather, the preliminary operation should preferably be conducted in a sufficient manner to ensure positive completion of the threshold voltage correction.

The above classification is based on a fixed measure, i.e., one horizontal period (1H). However, it is also possible to functionally understand the roughly four horizontal periods shown in FIG. 6(F).

More specifically, as illustrated at the top of FIG. 6(A), a light emission period (LM0) for the screen preceding by one field (or frame) is followed by the "preliminary operation." The preliminary operation includes a discharge period (D-CHG), initialization period (INT), first threshold correction period (VTC1), first standby period (WATT), second threshold correction period (VTC2) and second standby period (WAT2). The preliminary operation is followed by the "main operation." The main operation includes, in chronological order, a third threshold correction period (VTC3), third standby period (WAT3) and writing and mobility correction period (W&μ). The main operation is followed by a light emission period (LM1) for the pixel circuits 3(1,j) in the first row.

[Outline of the Drive Pulse]

Further, reference symbols T0 to T21 are shown as appropriate in the waveform diagrams of FIG. 6 to denote different times. Next, the video signal and drive pulse will be outlined with reference to these times.

In the case of the write drive pulse WS(1) supplied to the first row, four sampling pulses (SP0 to SP3), which are inactive at low level and active at high level, appear in a periodic manner. At this time, these pulses (SP0 to SP3) occur at constant intervals throughout the preliminary operation (time T0 to time T15) and main operation (after time T15). It should be noted, however, that the write drive pulse WS(1) in the main operation has a waveform in which a write pulse (WP) is added after the fourth sampling pulse (SP3).

On the other hand, the video signal Ssig is supplied to the m (several hundred to one thousand and several hundred) video signal lines DTL(j) (refer to FIGS. 1 and 5). The same signal Ssig is supplied simultaneously to the m video signal lines DTL(j) in line sequential display. As illustrated in FIG. 6(A), the signal amplitude Vin reflecting the data voltage obtained after the sampling of the video signal Ssig corresponds to the peak value of a video signal pulse (PP) which appears repeatedly in the second half of one horizontal period (1H). This peak value is relative to an offset potential (Vo) which appears in the first half of one horizontal period (1H). The signal amplitude Vin will be hereinafter referred to as the data voltage Vin.

Of the several video signal pulses (PP) shown in FIG. 6(A), the write pulse WP and the video signal pulse (PPx) appearing during the main operation is essential for the first row. This pulse coincides in time with the write pulse (WP). The peak value of the video signal pulse (PPx) relative to the offset potential (Vo) in the main operation corresponds to the gray level to be displayed (written) shown in FIG. 6, i.e., the data voltage Vin. This gray level (=Vin) may be the same for all pixels in the first row (for monochrome display). Normally, however, this level changes according to the gray level of the display pixel row. FIG. 6 is intended primarily to describe the operation of one of the pixels in the first row. However, the driving of other pixels in the same row is in itself controlled in parallel with the driving of the single pixel illustrated in FIG. 6 except that the display gray level may be different between the pixels.

The power drive pulse DS(1) applied to the drain of the drive transistor Md (refer to FIG. 5) is maintained at inactive low level as illustrated in FIG. 6(B2) from time T0 to immediately prior to the beginning (time T6) of the first threshold correction period (VTC1). The inactive low level is, for example, the reference voltage Vcc_L (e.g., negative voltage). Then, the power drive pulse DS(1) changes to active high level (e.g., high potential Vcc_H) almost simultaneously with the beginning (time T6) of the first threshold correction period (VTC1). The same pulse DS(1) is maintained at the high potential Vcc_H until the end of the light emission period (LM1).

As illustrated in FIGS. 6(C1), 6(C2), 6(D1) and 6(D2), the pulses are applied to the pixel circuits 3(2,j) and 3(3,j) in the second and third rows respectively with a delay of one horizontal period (1H). More specifically, the first sampling pulse (SP0) for the initialization period (INT) is applied to the second row from time T5 to T7 during which the second sampling pulse (SP1) for the first threshold correction period (VTC1) is applied to the first row.

While this pulse is applied, that is, at time T6, the power drive pulse DS(1) for the first row changes to high level (high potential Vcc_H), which activates this pulse.

Then, the second sampling pulse (SP1) is applied to the second row with a delay of one horizontal period (1H) from that applied to the first row from time T10 to T12 during which the third sampling pulse (SP2) for the second threshold correction period (VTC2) is applied to the first row. During the same time period, the first sampling pulse (SP0) is applied to the third row with a delay of two horizontal periods ((1H)× 2) from that applied to the first row.

While this pulse is applied, that is, at time T11, the power drive pulse DS(2) for the second row changes to high level (high potential Vcc_H), which activates this pulse.

Then, the third sampling pulse (SP2) is applied to the second row with a delay of one horizontal period (1H) from that applied to the first row from time T15 to T17 during which the fourth sampling pulse (SP3) for the third threshold correction period (VTC3) is applied to the first row. During the same time period, the second sampling pulse (SP1) is applied to the third row with a delay of two horizontal periods ((1H)×2) from that applied to the first row.

While this pulse is applied, that is, at time T16, the power drive pulse DS(3) for the third row changes to high level (high potential Vcc_H), which activates this pulse.

Designing the pulse application timings as described above makes it possible to perform, in parallel with the main operation of a given row, the preliminary operation of other rows whose main operation will be performed one or more horizontal periods later. As far as the main operation is concerned, it is conducted on a row-by-row basis in a seamless manner. Therefore, there is no waste of time except for the first several horizontal periods.

Because the display screen normally includes several hundred to one thousand and several hundred rows, one to several horizontal periods during the display of one screen is negligibly small. Therefore, there is substantially no time loss even when the threshold correction is performed in several steps.

A description will be given next of the changes in potential of the source and gate of the drive transistor Md shown in FIGS. 6(E) and 6(F) and the operation associated with these changes when the pulses are controlled as described above. This description will be given for each of the periods shown in FIG. 6(A).

It should be noted that, here, reference will be made, as appropriate, to the explanatory diagram of the preliminary operation of the pixel circuit 3(1,j) in the first row shown in FIGS. 7(A) to 9(B), graph of the change in the source potential Vs over time shown in FIG. 10, explanatory diagram of the main operation of the pixel circuit 3(1,*j*) in the first row shown in FIGS. 11(A) to 11(C) and also to other drawings such as FIG. 5.

[Light Emission Period for the Previous Screen (LM0)]

For the pixel circuit 3(1,*j*) in the first row, the write drive pulse WS(1) is at low level as illustrated in FIG. 6(B1) during the light emission period (LM0) for the screen preceding by one field or one frame earlier than time T0 (hereinafter referred to as the previous screen). As a result, the sampling transistor Ms is off. At this time, on the other hand, the power drive pulse DS(1) is at the level of the high potential Vcc_H as illustrated in FIG. 6(B2).

At this time, as illustrated in FIG. 7(A), the organic light-emitting diode OLED is emitting light according to a data voltage Vin0. The same voltage Vin0 is held after being fed to the gate of the drive transistor Md by the data write operation for the previous screen. The drive transistor Md is designed to operate in the saturation region. Therefore, the drive current Id (=Ids) flowing through the organic light-emitting diode OLED takes on the value calculated by the equation shown in FIG. 4 according to the gate-to-source voltage Vgs of the drive transistor Md held by the holding capacitor Cs.

[Discharge Period (D-CHG)]

The processes adapted to display a new screen by line sequential scan begin from time T0 in FIG. 6.

At time T0, the horizontal pixel line drive circuit 41 (refer to FIG. 5) changes the power drive pulse DS(1) from the high potential Vcc_H to the reference potential Vcc_L as illustrated in FIG. 6(B2). In the drive transistor Md, the potential of the node which has been functioning as the drain until that time is sharply pulled down to the reference potential Vcc_L. As a result, the relationship in potential between the source and drain is reversed. Therefore, the node which has been functioning as the drain serves as the source, and the node which has been functioning as the source as the drain to discharge the charge from the drain (however, reference symbol Vs remains unchanged as the source potential).

Therefore, the drain current Ids flows in reverse direction until now through the drive transistor Md as illustrated in FIG. 7(B).

The period of time during which the current flows in reverse direction through the same transistor Md is written as the discharge period (D-CHG) in FIG. 6.

When the discharge period (D-CHG) begins, the source potential Vs (drain potential in the practical operation) of the drive transistor Md discharges sharply from time T0 as illustrated in FIG. 6(F), causing the same potential Vs to decline close to the low potential Vcc_L.

At this time, if the low potential Vcc_L is smaller than the sum of a threshold voltage Vth_oled. and a cathode potential Vcath of the organic light-emitting diode OLED, i.e., Vcc_L<Vth_oled.+Vcath, then the same diode OLED will stop emitting light.

It should be noted that the potential of the video signal Ssig is pulled down from the data potential Vsig to the data reference potential Vo prior to the end (time T1) of the discharge period (D-CHG), as illustrated in FIG. 6(A).

At time T0, the sampling transistor Ms is off as illustrated in FIG. 7(B), causing the control node NDc to float. As a result, the gate voltage Vg of the drive transistor Md declines from time T0 as illustrated in FIG. 6(E).

[Initialization Period (INT)]

Next, the write signal scan circuit 42 (refer to FIG. 5) changes the write drive pulse WS(1) from low to high level at time T1 as illustrated in FIG. 6(B1), thus supplying the first sampling pulse (SP0) to the gate of the sampling transistor Ms.

At time T1, the discharge period (D-CHG) ends, initiating the initialization period (INT).

In response to the application of the sampling pulse (SP0) at time T1, the sampling transistor Ms turns on as illustrated in FIG. 7(C). As described earlier, the potential of the video signal Ssig is changed to the data reference potential Vo by time T1. Therefore, the sampling transistor Ms samples the data reference potential Vo of the video signal Ssig and transfers the data reference potential Vo to the gate of the drive transistor Md.

This sampling operation causes the gate voltage Vg of the drive transistor Md, which declined from time T0, to converge to the data reference potential Vo, as illustrated in FIG. 6(E).

The sampling pulse (SP0) shown in FIG. 6(B1) begins from time T1 and ends at time T2 when a sufficient time has elapsed for the convergence of the potential, thus turning off the sampling transistor Ms. As a result, the gate of the drive transistor Md floats until time T5 when the sampling transistor Ms turns on the next time.

The sampling transistor Ms is controlled to turn on again at time T5 almost at the same time as the end of the first horizontal period (1H). Further, the same transistor Ms turns on again so that the video signal pulse (PP) in the first horizontal period (1H) fits into the period of time from T2 to T5 (refer to FIGS. 6(A) and 6(B1)).

If this is viewed from the standpoint of the sampling pulse (SP0), the duration of the same pulse (SP0) (time T1 to T2) adapted to raise the write drive pulse WS(1) to high level is in the first half of the horizontal period (1H) and falls within the period of time (time T0 to T3) during which the video signal Ssig is at the data reference potential Vo.

Then, at time T2, the sampling transistor Ms is turned off. With the sampling transistor Ms turned off, there is a wait until time T4 when the variation in potential of the video signal line DTL(j) by the video signal pulse (PP) ends. Then, at time T5, the second sampling pulse (SP1) is activated to sample the data reference potential Vo again.

This control prevents the data potential Vsig of the video signal Ssig to be erroneously sampled at time T5 when the second sampling pulse (SP1) is activated.

It should be noted that, as illustrated in FIG. 6(E), the gate voltage Vg is already at the data reference potential Vo when the second sampling begins at time T5. In general, therefore, the gate voltage Vg barely changes although the second sampling may make up for an extremely small loss caused, for example, by leak current.

Going slightly back to the description made on the time axis, the sampling transistor Ms turns on at time T1 as a result of the application of the first sampling pulse (SP0). When the gate voltage Vg of the drive transistor Md converges to the data reference potential Vo as illustrated in FIG. 6(E), in conjunction with this, the voltage held by the holding capacitor Cs declines to "Vo−Vcc_L" (FIG. 6(F)). This decline is caused by the fact that the discharge shown in FIG. 7(B) has pushed the source potential Vs down to the low potential Vcc_L and that the voltage held by the holding capacitor Cs is restricted by the gate voltage Vg relative to the low potential Vcc_L. That is, as the gate voltage Vg drops to the data reference potential Vo, in conjunction with this, the voltage held by the holding capacitor Cs also drops and converges to "Vo−Vcc_L" as shown in FIG. 7(C). It should be noted that this held voltage "Vo−Vcc_L" is none other than the gate-to-source voltage Vgs. Unless the same voltage Vgs is greater than the threshold voltage Vth of the drive transistor Md, the threshold voltage correction operation cannot be performed later. As a result, the potential relationship is established so that "Vo−Vcc_L>Vth."

As described above, the preparations for the threshold correction operation are completed by initializing the gate voltage Vg and source potential Vs of the drive transistor Md.

[First Threshold Correction Period (VTC1)]

The sampling transistor Ms begins to sample the Vo the second time at time T5. Then, when the power drive pulse DS(1) rises from the VSS level to the VDD level at time T6 as shown in FIG. 6(B2), the initialization period (INT) ends, initiating the first threshold correction period (VTC1).

The sampling transistor Ms which is on is sampling the data reference potential Vo immediately prior to time T6, the beginning of the first threshold correction period (VTC1). Therefore, the gate voltage Vg of the drive transistor Md is electrically fixed at the constant data reference potential Vo.

In this condition, the horizontal pixel line drive circuit 41 (refer to FIG. 5) raises the power drive pulse DS(1) from low level (=VSS) to high level (=VDD) at time T6 as illustrated in FIG. 6(B2). From time T6 onward, the horizontal pixel line drive circuit 41 maintains the potential of the power supply line to the drive transistor Md at the high potential Vcc_H until the beginning of the processes for the next frame (or field).

As the power drive pulse DS(1) rises, the "VDD–VSS" voltage is applied between the source and drain of the drive transistor Md. This causes the drain current Ids to flow through the drive transistor Md from the power supply.

The drain current Ids charges the source of the drive transistor Md, thus pushing up the source potential Vs as illustrated in FIG. 6(F). As a result, the gate-to-source voltage Vgs (voltage held by the holding capacitor Cs) of the drive transistor Md which has taken on the value "Vo–Vcc_L" up until that time declines gradually (FIGS. 6(E) and 6(F)).

At this time, the source of the drive transistor Md is not charged very quickly by the drain current Ids. The reasons for this will be given below with reference to FIG. 8(A).

As illustrated in FIG. 8(A), a gate bias voltage applied to the gate voltage Vg of the drive transistor Md is not very large because this voltage is restricted by the data reference potential Vo. Therefore, the drive transistor Md is only slightly on, that is, is on with only limited driving capability (first reason).

Further, although the drain current Ids flows into the holding capacitor Cs, the same drain current Ids is also consumed to charge a capacitance Coled. of the organic light-emitting diode OLED. As a result, the source potential Vs does not readily increase (second reason).

Still further, the sampling pulse (SP1) must be terminated at time T7 which is before time T8 when the video signal Ssig changes to the data potential Vsig the next time (refer to FIG. 6(B1)). Therefore, the charging time of the source potential Vs is not sufficient (third reason).

Figure 10:
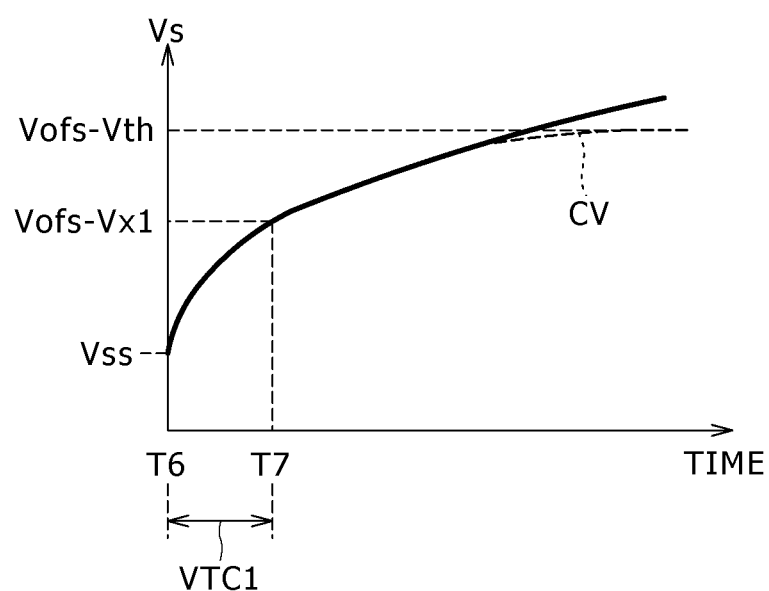
FIG. 10 is a graph illustrating the change in source potential over time according to the embodiment of the present invention.

Assuming that the second sampling pulse (SP1) shown in FIG. 6(B1) can last for a sufficiently long time beyond time T7, the source potential Vs of the drive transistor Md (anode potential of the organic light-emitting diode OLED) begins to increase from time T6 and continues to do so over time and eventually converges to "Vo–Vth" (curve CV shown by a dashed line in FIG. 10). That is, the source potential Vs should stop increasing when the gate-to-source voltage Vgs (voltage held by the holding capacitor Cs) exactly matches the threshold voltage Vth of the drive transistor Md.

[First Standby Period (WAT1)]

Practically, however, time T7 comes before the convergence point is reached. This terminates the duration of the sampling pulse (SP1), thus terminating the first threshold correction period (VTC1) and initiating the first standby period (WAT1).

More specifically, when the gate-to-source voltage Vgs of the drive transistor Md becomes equal to Vx1 (>Vth), that is, when the source potential Vs of the same transistor Md rises to "Vo–V≤1" from the low potential Vcc_L (at time T7), the first threshold correction period (VTC1) ends as shown in FIG. 10. At this time (time T7), the voltage Vx1 is held by the holding capacitor Cs.

When the first threshold correction period (VTC1) ends, the sampling transistor Ms turns off. This places the gate of the drive transistor Md, which has been electrically fixed at the data reference potential Vo, in an electrical floating state.

From time T7 onward, therefore, as the source potential Vs rises, the potential of the gate (Vg) in a floating state capacitively coupled to the source will also rise (FIGS. 6(E) and 6(F)). As a result, in the present example, the source potential Vs becomes larger than the target convergence point "Vo–Vth" (refer to FIG. 10) at the end (time T10) of the first standby period (WATT). On the other hand, the gate-to-source voltage Vgs remains unchanged as illustrated in FIGS. 6(E) and 6(F).

As in the initialization period (INT) described earlier, it is necessary to wait for the video signal pulse (PP) to elapse in the first standby period (WATT). Therefore, this period is called the "standby period" in this respect. However, a relatively long standby period as that lasting from time T7 to T10 permits the gate voltage Vg to increase. Further, the gate-to-source voltage Vgs does not converge to the threshold voltage Vth as described above.

In FIG. 6(E), the increment of the gate voltage Vg during the first standby period (WAT1) is denoted by reference symbol Va1. Letting the increment of the source potential Vs contributing to the increase in the gate voltage Vg through bootstrapping action via the coupling capacitance (holding capacitor Cs) be also denoted by reference symbol Va1, the source potential Vs becomes equal to "Vo–Vx1+Va1" at the end (time T10) of the first standby period (WAT1) (refer to FIG. 8(B)).

Therefore, it is necessary to bring the gate potential back to the data reference potential Vo, i.e., the initialization level, and perform the threshold voltage correction again.

[Second Threshold Correction Period (VTC2)]

In the operation example of the present embodiment, therefore, the same processes as those performed during the first threshold correction period (VTC1) and first standby period (WAT1) of the previous horizontal period (1H) (time T5 to T10) are performed during the next horizontal period (1H) (time T10 to T15). That is, the second threshold correction period (VTC2) and second standby period (WAT2) are performed in the next horizontal period (1H).

However, the gate-to-source voltage Vgs (holding voltage held by the holding capacitor Cs) reduces to "Vx1" at time T10 when the second threshold correction period (VTC2) begins. This "Vx1" is smaller than "Vo–Vcc_L" which is a relatively large value assumed by the gate-to-source voltage Vgs (voltage held by the holding capacitor Cs) at time T5 when the first threshold correction period (VTC1) begins.

When the sampling transistor Ms turns on at time T10 as the sampling pulse (SP2) rises as illustrated in FIG. 6(B1), the gate voltage Vg (=Vo+Va1) of the drive transistor Md is connected to the video signal line DTL(j) at a lower potential (Vo). This causes a current corresponding to this difference (Va1) to flow from the gate of the drive transistor Md to the video signal line DTL(j), forcing the gate voltage Vg down to the data reference potential Vo as illustrated in FIG. 8(C).

The variation in potential (Va1) of the gate of the drive transistor Md is fed to the source of the same transistor Md via the holding capacitor Cs and a gate-to-source parasitic capacitance Cgs of the same transistor Md, thus pulling down the source potential Vs.

The decrement of the source potential Vs at this time is denoted by reference symbol "g*Va1." Here, the capacitive coupling ratio g is expressed as g=(Cgs+Cs)/(Cgs+Cs+Coled.) where Cgs represents the gate-to-source parasitic capacitance, (Cs) the same reference symbol as the holding capacitor Cs and represents the capacitance thereof, and Coled. represents the capacitance of the organic light-emitting diode OLED. Therefore, the source potential Vs drops by "g*Va1" to "Vo−Vx1+(1−g)Va1" from its immediately previous level or "Vo−Vx1+(1−g)Va1."

The capacitive coupling ratio g takes on a value smaller than 1, as is clear from the definition equation. Therefore, the change "g*Va1" of the source potential Vs is smaller than the change (Va1) of the gate voltage Vg.

Here, if the gate-to-source voltage Vgs (="Vx1−(1−g)Va1") of the drive transistor Md is greater than the threshold voltage Vth of the same transistor Md, the drain current Ids flows as illustrated in FIG. 8(C). The drain current Ids attempts to flow until the drive transistor Md goes into cutoff as a result of the source potential Vs of the drive transistor Md becoming equal to "Vo−Vth." In the operation example of the present embodiment, however, the sampling pulse (SP2) ends at time T12 when the gate-to-source voltage Vgs becomes equal to "Vx2" (where Vx2 is large enough to satisfy the condition Vx1>Vx2>Vth), as illustrated in FIGS. 6(E) and 6(F). As a result, the sampling transistor Ms turns off. The voltage held by the holding capacitor Cs at time T12 is "Vx2."

[Second Standby Period (WAT2)]

The second standby period (WAT2) begins from time T12.

During the second standby period (WAT2), the sampling transistor Ms is off, causing the gate voltage Vg to electrically float, as during the previous first standby period (WATT). As a result, as the source potential Vs rises, the gate voltage Vg will also rise (refer to FIG. 9(A)).

However, the effect of the increase in potential of the gate voltage Vg (bootstrapping effect) is not very large because the gate-to-source voltage Vgs at the beginning of the standby period is close to the control target "Vth." As can be seen from time T12 to T15 in FIGS. 6(E) and 6(F), both the source potential Vs and gate voltage Vg increase only slightly.

More specifically, letting the increment of the source potential Vs resulting from the flow of the drain current Ids during the second standby period (WAT2) in FIG. 9(A) be denoted by reference symbol Va2, the source potential Vs becomes equal to "Vo−Vx2+Va2" at the end of the standby period (time T15 in FIG. 6). This increase in the source potential by "Va2" is transferred to the gate in a floating state via the gate-to-source parasitic capacitance Cgs and holding capacitor Cs. As a result, the gate voltage Vg will also increase by the same increment or the potential Va2. It should be noted, however, that the increment "Va2" of the potential of the gate voltage Vg is far smaller than the increment "Va1" of the potential thereof during the first standby period (WATT) as illustrated in FIG. 6(E).

[Third Threshold Correction Period (VTC3)]

The "main operation" begins from time T15, initiating the third threshold correction period (VTC3).

The same processes as those performed during the second threshold correction period (VTC2) are performed during time T15 to T17 the third threshold correction period (VTC3).

However, the gate-to-source voltage Vgs (voltage held by the holding capacitor Cs) reduces to "Vx2" at time T15 when the third threshold correction period (VTC3) begins. This "Vx2" is even smaller than "Vx1" which is a relatively large value assumed by the gate-to-source voltage Vgs (voltage held by the holding capacitor Cs) at time T10 when the second threshold correction period (VTC2) begins.

The description of the basic operation will be omitted to avoid redundancy. The description of the second threshold correction period (VTC2) is applicable to the third threshold correction period (VTC3) by replacing "Va1" with "Va2" and "Vx1" with Vx2." This is also obvious from the comparison between FIG. 8(C) and FIG. 9(B).

It should be noted that the third threshold correction period (VTC3) differs from the second one (VTC2) in that the gate-to-source voltage Vgs (voltage held by the holding capacitor Cs) becomes equal to the threshold voltage Vth by time T17 when the third threshold correction period (VTC3) ends, as illustrated in FIGS. 6(E) and 6(F). Therefore, the drive transistor Md goes into cutoff when the gate-to-source voltage Vgs becomes equal to the threshold voltage Vth. From this moment onward, the drain current Ids will not flow. At this time, the source potential Vs of the drive transistor Md is "Vo−Vth."

As described above, the threshold voltage correction performed a plurality of times (three times in the present example) with a standby period provided therebetween permits the voltage held by the holding capacitor Cs to converge in a stepped manner. In the course of the convergence, the held voltage remains constant during the standby periods and eventually converges to the threshold voltage Vth.

Here, assuming that the gate-to-source voltage of the drive transistor increases by "Vin," then the same voltage is equal to "Vin+Vth." We consider two drive transistors, one having the large threshold voltage Vth and another having the small threshold voltage Vth.

The former with the large threshold voltage Vth has the large gate-to-source voltage commensurate with the large threshold voltage Vth. In contrast, the latter with the small threshold voltage Vth has the small gate-to-source voltage commensurate with the small threshold voltage Vth. Therefore, as far as the threshold voltage Vth is concerned, it is possible to pass the same amount of the drain current Ids through the drive transistor for the same data potential Vin by canceling the variation in the threshold voltage Vth using the threshold voltage correction operation.

During the three threshold correction periods, namely, the first, second and third threshold correction periods (VTC1), (VTC2) and (VTC3), it is necessary to ensure that the drain current Ids is wholly consumed for it to flow into one of the electrodes of the holding capacitor Cs, i.e., one of the electrodes of the capacitance Coled. of the organic light-emitting diode OLED, so that the same diode OLED does not turn on. If the anode voltage of the same diode OLED is denoted by reference symbol Voled., the threshold voltage thereof by reference symbol Vth_oled., and the cathode voltage thereof by reference symbol Vcath, the equation "Voled. Vcath+Vth_oled." must always hold in order for the same diode OLED to remain off.

Assuming here that the cathode potential Vcath of the organic light-emitting diode OLED is constant at the low potential Vcc_L (e.g., ground voltage GND), the above equation can hold at all times if the threshold voltage Vth_oled. is extremely large. However, the threshold voltage Vth_oled. is determined by the manufacturing conditions of the organic light-emitting diode OLED. Further, the same voltage Vth_oled. cannot be increased excessively to achieve efficient light emission at low voltage. Therefore, the organic light-emitting diode OLED should preferably be reverse-biased by setting the cathode potential Vcath larger than the low potential Vcc_L until the three threshold correction periods and the mobility correction period, which will be described below, ends.

[Third Standby Period (WAT3)]

A description has been given above of the threshold voltage correction. In the present operation example, the threshold voltage correction is followed by a standby period for the writing and mobility correction (third standby period (WAT3)). Unlike the first and second standby periods (WAT1) and (WAT2), the third standby period (WAT3) is a short period of stand by time designed simply to prevent the erroneous sampling of the video signal Ssig at an unstable potential during the writing and mobility correction performed thereafter.

As illustrated in FIG. 6(B1), the third standby period (WAT3) begins at time T17 when the sampling pulse (SP3) changes from high to low level.

Figure 11:
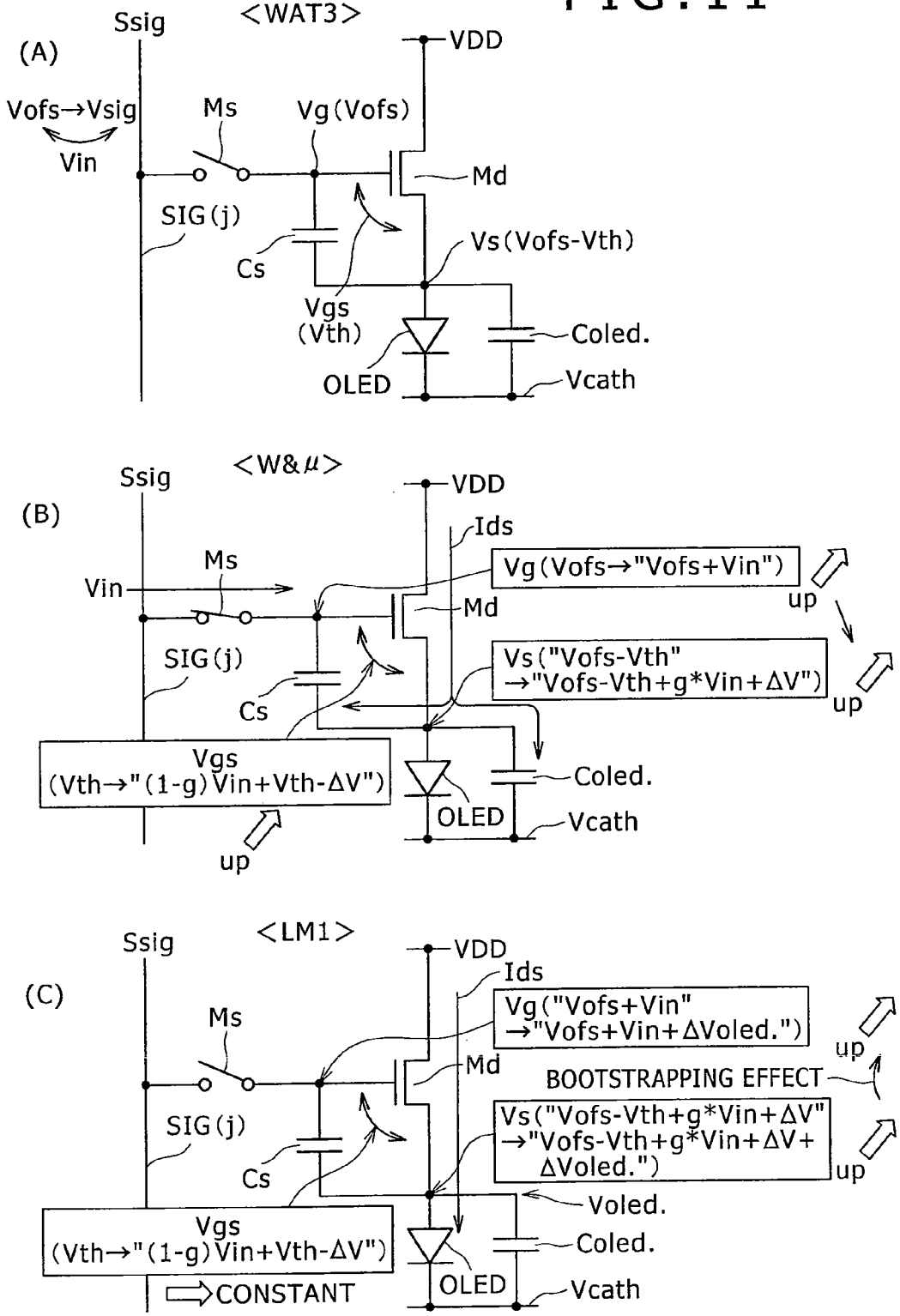
FIG. 11 is a diagram describing the operation until a light emission period.

In the third standby period (WAT3), the video signal pulse (PPx) having the data potential Vsig to be displayed by the pixel circuit 3(1,j) as illustrated in FIG. 6(A) is supplied to the video signal line DTL(j) as the video signal Ssig at time T18 during this period (refer to FIG. 11(A)). In the video signal Ssig, the difference between the data potential Vsig and data reference potential Vo corresponds to the data voltage Vin for the gray level to be displayed by the pixel circuit. That is, the data potential Vsig is equal to "Vo+Vin."

The third standby period (WAT3) ends at time T19 when the video signal Ssig is constant at the data potential Vsig following the change in potential at time 18.

[Writing and Mobility Correction Period (W&µ)]

The writing and mobility correction period (W&µ) begins from time T19.

As illustrated in FIG. 6(B1), the write pulse (WP) is supplied to the gate of the sampling transistor Ms at time T19 during the application of the video signal pulse (PPx) for the main operation. This turns on the sampling transistor Ms, causing the difference between the data potential Vsig (=Vo+Vin) of the video signal line DTL(j) and the gate voltage Vg (=Vo), i.e., the data voltage Vin, to be fed to the gate of the drive transistor Md, as illustrated in FIG. 11(B). As a result, the gate voltage Vg is equal to "Vo+Vin."

As the gate voltage Vg rises by the data voltage Vin, the source voltage Vs will also rise. At this time, the data voltage Vin is not transferred "as-is" to the source potential Vs. Instead, the source potential Vs will rise only by the change of the data voltage Vin proportional to the capacitive coupling ratio g, i.e., "g*Vin." Therefore, the source potential Vs after the change is equal to "Vo−Vth+g*Vin." As a result, the gate-to-source voltage Vgs of the drive transistor Md is equal to "(1−g)Vin+Vth."

Here, a description will be given of the variation due to the mobility µ.

In the three threshold voltage corrections performed up to this point, the drain current Ids contains, in fact, an error resulting from the mobility µ each time the drain current Ids flows. However, the error caused by the mobility µ was not discussed (definitely) in a strict manner as problematic because the variation in the threshold voltage Vth was large. At this time, the description was given by writing the voltages simply as "Va1" and "Va2" to represent the results rather than using the capacitive coupling ratio g. This was done to avoid complication associated with describing the variation in the mobility.

As already explained, on the other hand, the threshold voltage Vth is held by the holding capacitor Cs after a threshold voltage correction performed in a strict manner. If the drive transistor Md is turned on thereafter, the drain current Ids will remain unchanged irrespective of the magnitude of the threshold voltage Vth. Therefore, assuming that the voltage held by the holding capacitor Cs (gate-to-source voltage Vgs) changes due to the drive current Id at the time of the conduction of the drive transistor Md after the threshold voltage correction, this amount of change ΔV (positive or negative) reflects not only the variation in the mobility µ of the drive transistor Md, and more precisely, the mobility which, in a strict sense, is a physical parameter of the semiconductor material, but also the comprehensive variation in those factors affecting the current driving capability in terms of transistor structure or manufacturing process.

Going back to the description of the operation in consideration of the above, when the data voltage Vin is added to the gate potential Vg after the sampling transistor Ms has turned on in FIG. 11(B), the drive transistor Md attempts to pass the drain current Ids, commensurate in magnitude with the data voltage Vin (gray level), between the drain and source. At this time, the drain current Ids varies according to the mobility p. As a result, the source potential Vs is given by "Vo−Vth+g*Vin+ΔV," which is the sum of "Vo−Vth+g*Vin" and the amount of change ΔV resulting from the mobility µ.

At this time, in order for the organic light-emitting diode OLED not to emit light, it is only necessary to set the cathode potential Vcath in advance according, for example, to the data voltage Vin and capacitive coupling ratio g so that the equation Vs(=Vo−Vth+g*Vin+ΔV)<Vth_oled.+Vcath is satisfied.

Setting the cathode potential Vcath in advance as described above reverse-biases the organic light-emitting diode OLED, bringing the same diode OLED into a high impedance state. As a result, the organic light-emitting diode OLED does not emit light and exhibits a simple capacitive characteristic rather than a diode characteristic.

At this time, so long as the above equation is satisfied, the source potential Vs will not exceed the sum of the threshold voltage Vth_oled. and cathode potential Vcath of the organic light-emitting diode OLED. Therefore, the drain current Ids (drive current Id) is used to charge a combined capacitance C=Cs+Coled.+Cgs which is the sum of three capacitance values. These are the capacitance of the holding capacitor Cs (denoted by the same reference symbol Cs), that of the equivalent capacitance of the organic light-emitting diode OLED (denoted by the same reference symbol Coled. as the parasitic capacitance) when the same diode OLED is reverse-biased and that of a parasitic capacitance (denoted by Cgs) existing between the gate and source of the drive transistor Md. This causes the source potential Vs of the drive transistor Md to rise. At this time, the threshold voltage correction operation of the drive transistor Md is already complete. Therefore, the drain current Ids flowing through the same transistor Md reflects the mobility µ.

As shown in the equation (1−g)Vin+Vth−ΔV in FIGS. 6(E) and 6(F), as far as the gate-to-source voltage Vgs held by the holding capacitor Cs is concerned, the change ΔV added to the source potential Vs is subtracted from the gate-to-source voltage Vgs (=(1−g)Vin+Vth) after the threshold voltage correction. Therefore, the change ΔV is held by the holding capacitor Cs so that a negative feedback is applied. As a result, the change ΔV will also be hereinafter referred to as a "negative feedback amount."

The negative feedback amount ΔV can be expressed by the equation ΔV=t*Ids/(Coled.+Cs+Cgs) when the organic light-emitting diode OLED is reverse-biased. It is clear from this equation that the change ΔV is a parameter which changes in proportion to the change of the drain current Ids.

From the equation of the feedback amount ΔV, the same amount ΔV added to the source potential Vs is dependent upon the magnitude of the drain current Ids (this magnitude has a positive correlation with the magnitude of the data voltage Vin, i.e., the gray level) and the period of time during which the drain current Ids flows, i.e., time (t) from time T19 to time T20 demanded for the mobility correction shown in FIG. 6(B1). That is, the larger the gray level and the longer the time (t), the larger the negative feedback amount ΔV.

Therefore, the mobility correction time (t) need not always be constant. Rather, it may be more appropriate to adjust the mobility correction time (t) according to the drain current Ids (gray level). For example, when the gray level is almost white with the drain current Ids being large, the mobility correction time (t) should be short. In contrast, when the gray level is almost black with the drain current Ids being small, the mobility correction time (t) should be long. This automatic adjustment of the mobility correction time according to the gray level can be implemented by providing this functionality, for example, in the write signal scan circuit 42 in advance.

[Light Emission Period (LM1)]

The writing and mobility correction period (W&μ) ends at time T20, initiating the light emission period (LM1).

The write pulse (WP) ends at time T20, turning off the sampling transistor Ms and causing the gate of the drive transistor Md to electrically float.

Incidentally, in the writing and mobility correction period (W&μ) prior to the light emission period (LM1), the drive transistor Md may not always be able to pass the drain current Ids commensurate with the data voltage Vin despite its attempt to do so. The reason for this is as follows. That is, the gate voltage Vg of the drive transistor Md is fixed at Vo+Vin if the current level (Id) flowing through the organic light-emitting diode OLED is considerably smaller than that (Ids) flowing through the drive transistor Md because the sampling transistor Ms is on. The source potential Vs attempts to converge to the potential (Vofs+Vin−Vth) which is lower by the threshold voltage Vth from Vofs+Vin. Therefore, no matter how long the mobility correction time (t) is extended, the source potential Vs will not exceed the above convergence point. The mobility should be corrected by monitoring the difference in the mobility μ based on the difference in time demanded for the convergence. Therefore, even if the data voltage Vin close to white that has the maximum brightness is supplied, the end point of the mobility correction time (t) is determined before the convergence is achieved.

When the gate of the drive transistor Md floats after the light emission period (LM1) has begun, the source potential Vs of the same transistor Md is allowed to rise further. Therefore, the drive transistor Md acts to pass the drive current Id commensurate with the supplied data voltage Vin.

This causes the source potential Vs (anode potential of the organic light-emitting diode OLED) to rise. After a while, the organic light-emitting diode OLED is no longer reverse-biased. As a result, the drain current Ids begins to flow through the same diode OLED as the drive current Id as illustrated in FIG. 11(C), causing the same diode OLED to emit light. Shortly after the light emission begins, the drive transistor Md is saturated with the drain current Ids commensurate with the supplied data voltage Vin. When the same current Ids (=Id) is brought to a constant level, the organic light-emitting diode OLED will emit light at the brightness commensurate with the data voltage Vin.

The increase in the anode potential of the organic light-emitting diode OLED taking place from the beginning of the light emission period (LM1) to when the brightness is brought to a constant level is none other than the increase in the source potential Vs of the drive transistor Md. This increase in the source potential Vs will be denoted by reference symbol ΔVoled. to represent the increment of the anode voltage Voled. of the organic light-emitting diode OLED. The source potential Vs of the drive transistor Md becomes equal to "Vo−Vth+g*Vin+ΔV+ΔVoled." (refer to FIG. 6(F)).

On the other hand, the gate potential Vg increases by the increment ΔVoled. as does the source potential Vs as illustrated in FIG. 6(E) because the gate is floating. As the drain current Ids saturates, the source potential Vs will also saturate, causing the gate potential Vg to saturate.

As a result, the gate-to-source voltage Vgs (voltage held by the holding capacitor Cs) is maintained at the level during the mobility correction ("(1−g) Vin++Vth−ΔV") throughout the light emission period (LM1).

During the light emission period (LM1), the drive transistor Md functions as a constant current source. As a result, the I-V characteristic of the organic light-emitting diode OLED may change over time, changing the source potential Vs of the drive transistor Md.

However, the voltage held by the holding capacitor Cs is maintained at "(1−g)Vin+Vth−ΔV," irrespective of whether the I-V characteristic of the organic light-emitting diode OLED changes over time. The voltage held by the holding capacitor Cs contains two components, (+Vth) adapted to correct the threshold voltage Vth of the drive transistor Md and (−ΔV) adapted to correct the variation due to the mobility μ. Therefore, even if there is a variation in the threshold voltage Vth or mobility μ between different pixels, the drain current Ids of the drive transistor Md, i.e., the drive current Id of the organic light-emitting diode OLED, will remain constant.

More specifically, the larger the threshold voltage Vth, the more the drive transistor Md reduces the source potential Vs using the threshold voltage correction component (+Vth) contained in the held voltage, thus increasing the source-to-drain voltage so that the drain current Ids (drive current Id) flows in a larger amount. Therefore, the drain current Ids remains constant even in the event of a change in the threshold voltage Vth.

On the other hand, if the change ΔV is small because of the small mobility μ, the voltage held by the holding capacitor Cs will decline only to a small extent thanks to the mobility correction component (−ΔV) contained therein. This provides a relatively large source-to-drain voltage. As a result, the drive transistor Md operates in such a manner as to pass the drain current Ids (drive current Id) in a larger amount. Therefore, the drain current Ids remains constant even in the event of a change in the mobility μ.

As described above, the light emission brightness of the organic light-emitting diode OLED is maintained constant so long as the data voltage Vin is the same even in the event of a variation in the threshold voltage Vth or mobility μ between different pixels, and further irrespective of the change in I-V characteristic of the drive transistor Md over time.

<Differences in Pixel Circuit for Different Colors>

Assuming the above configuration and operation of the pixel circuit, a description will be given next of the features, i.e., the differences in pixel circuit configuration for different colors, of the display device according to the present embodiment.

The emission color varies depending on the organic material making up the organic film of the organic light-emitting diode OLED. Therefore, adjacent pixels differ in configuration including material actually even if they are identical in equivalent circuit of the pixel as described above.

Therefore, a pixel unit is made up of N (N≤3) consecutive pixels in the same row. Two pixel units are identical in configuration when a pixel unit is viewed as a unit. When three primary colors of RGB are used to display a color, an arbitrary color is displayed based on the proportions of light emission brightness between the each of three primary colors, and N=3. In the description given below, we assume that three primary colors of RGB are used to display a color, and that N=3.

As described above, a pixel unit is a minimum unit having the same configuration in a pixel array to display an arbitrary color. The present embodiment is characterized in that "a specific color pixel of a pixel unit has more sets of pixel circuit elements including the drive transistor, holding capacitor and light-emitting element than other color pixels and has two or more sets thereof." The number of "sets" in a pixel will be hereinafter referred to as a "set count." It should be noted that a detailed description of the "specific color" will be given later.

Here, the term "set" of pixel circuit elements refers to a set that includes at least the drive transistor Md, holding capacitor Cs and light-emitting element (organic light-emitting diode OLED in the present embodiment) as "pixel circuit elements" as described above. So long as the "set"-related requirement is satisfied, the pixel circuit may be not only a 2T1C circuit but also any of the pixel circuits 1, 2 and 3 or any of 4T-1C, 4T-2C, 5T-1C and 3T-1C pixel circuits.

It should be noted, however, that the pixel circuit 3, i.e., the pixel circuit configuration shown in FIG. 5, is the most preferred of all for a variety of advantages including use of N-channel amorphous silicon TFT, which is a TFT type that readily allows for expansion of the large screen, for all transistors (TFTs), simple circuit configuration, and implementation in advance of a correction mechanism for the threshold voltage Vth and mobility μ in the pixel circuit. The description will be continued below assuming that the pixel circuit shown in FIG. 5 is used.

In the present embodiment, the "specific color" is either a "specific color that is susceptible to a dark dot" or a "specific color that has the highest relative luminosity factor."

As for a "specific color that is susceptible to a dark dot", statistical investigation on colors and dark dot occurrence rate show that a certain color may be more likely to develop a dark dot than other colors. In this case, the color that is highly likely to develop a dark dot is regarded as a "specific color."

The investigation of the present inventor has revealed that a dark dot defect or a defect that is not as severe as a dark dot defect but that leads to a less-than-desired level of brightness (hereinafter referred to as a semi-dark dot) occurs due to several causes. One of the causes is interruption of current flow into the anode and cathode due to broken wiring in the formation process of the organic light-emitting diode OLED. Another cause is increased resistance of part of wiring or contact even if there is no broken wiring. Still another cause is a short circuit formed between the anode and cathode due to dust. As a result, the drive current of the organic light-emitting diode OLED flows through the short circuit and is consumed therein, causing no drive current to flow through the organic light-emitting diode OLED or only an insufficient amount of current to flow therethrough.

As far as the investigation of the present inventor is concerned, short circuit is the most frequent cause of the dark dot or semi-dark dot.

Figure 12:
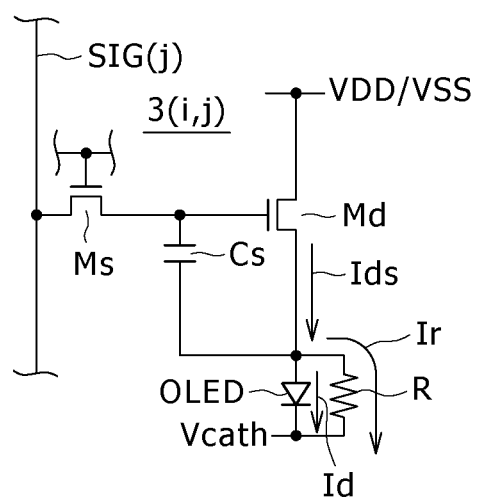
FIG. 12 is an equivalent circuit diagram of a pixel circuit according to the embodiment of the present invention in the event of a short circuit between electrodes of an organic light-emitting element.

FIG. 12 illustrates an equivalent circuit diagram of the pixel circuit 3(i,j) in the event of a short circuit formed between the anode and cathode of the organic light-emitting diode OLED.

If dust adheres to the organic multi-layered film of the organic light-emitting diode OLED during formation of the same film, the anode and cathode of the organic light-emitting diode OLED are electrically connected by a short circuit via a resistance R due to conductive dust or dust-caused pattern defect. In this case, the drain current Ids flowing through the drive transistor Md is divided into the drive current Id flowing through the organic light-emitting diode OLED and a current Ir flowing through the resistance R. As described earlier, the drain current Ids is a constant current commensurate with the data voltage fed in advance from a video signal line DTL(j). However, if the current Ir develops that flows through the resistance R, the drive current Id is lessened, thus resulting in reduced light emission brightness of the organic light-emitting diode OLED (semi-dark dot defect).

The semi-dark dot defect is not conspicuous when the resistance R is large. However, the smaller the resistance R, the greater the current Ir becomes and the smaller the drive current Id becomes, thus making the semi-dark dot defect more conspicuous. Then, when the resistance drops to a certain extent, the drive current Id no longer flows through the organic light-emitting diode OLED, thus developing a dark dot defect.

If the anode and cathode of the organic light-emitting diode OLED are electrically shorted via the resistance R due to adherence of dust of a given size, there is a tendency that the larger the dust, the more probable it is for the anode and cathode to become shorted, and that the larger the dust, the smaller the resistance R of the short circuit becomes. This is probably caused by the fact that because the organic multi-layered film is partially not formed around the dust, the anode and cathode metals come in direct contact or, though not in direct contact, an electric field concentrates in this area thus resulting in more leak current in this area. According to the investigation of the present inventor, there is a broad tendency that a dark dot or semi-dark dot defect is likely to develop in a color pixel whose organic light-emitting diode OLED has a relatively thin organic multi-layered film. This attests to the fact that the above cause of defect is correct.

In this case, the color pixel in a pixel unit in which the organic multi-layered film of the organic light-emitting diode OLED made up of a plurality of organic thin films is the smallest in total thickness may be regarded as a "specific color that is susceptible to a dark dot."

When three primary colors of RGB are used to display a color, which of the color pixels has the smallest total thickness of the organic multi-layered film varies depending on factors such as material and structure of the film. On the other hand, the total thickness varies depending on whether a light enhancement structure is used. The light enhancement structure is designed to enhance emitted light using a reflected light component. Therefore, it cannot be indiscriminately said which color pixel has the smallest total thickness. However, when three primary colors of RGB are used to display a color, there is a general tendency that the blue (B) pixel is smaller in total thickness than the other color pixels.

On the other hand, the "specific color that has the highest relative luminosity factor" is an expression representing how to determine a color pixel according to how severely the pixel is affected by a dark dot or semi-dark dot defect.

More specifically, human eyes are not equally sensitive to the three primary colors of RGB. Instead, they have different sensitivities (luminosity factors) to the different colors. Relative luminosity factor is a normalized parameter that represents the ratio of luminosity factor (unit: 1 m/W) of each of wavelengths to luminosity factor of the wavelength having the highest luminosity factor (555 nm in a bright area, 507 nm in a dark area).

In the case of RGB, human eyes have the highest relative luminosity factor for green (G). On the other hand, it is said that Europeans and Americans have a relatively higher relative luminosity factor to blue (B) than Japanese.

Therefore, if a dark dot defect develops in a pixel of a pixel unit on a screen adapted to display a color, the defect is likely to be conspicuous when the pixel is green (G). When the pixel is red (R) or blue (B), the defect is unlikely to be conspicuous. Therefore, when three primary colors of RGB are used to display a color, it can be safely said that green (G) is the "specific color that has the highest relative luminosity factor."

Figure 13:
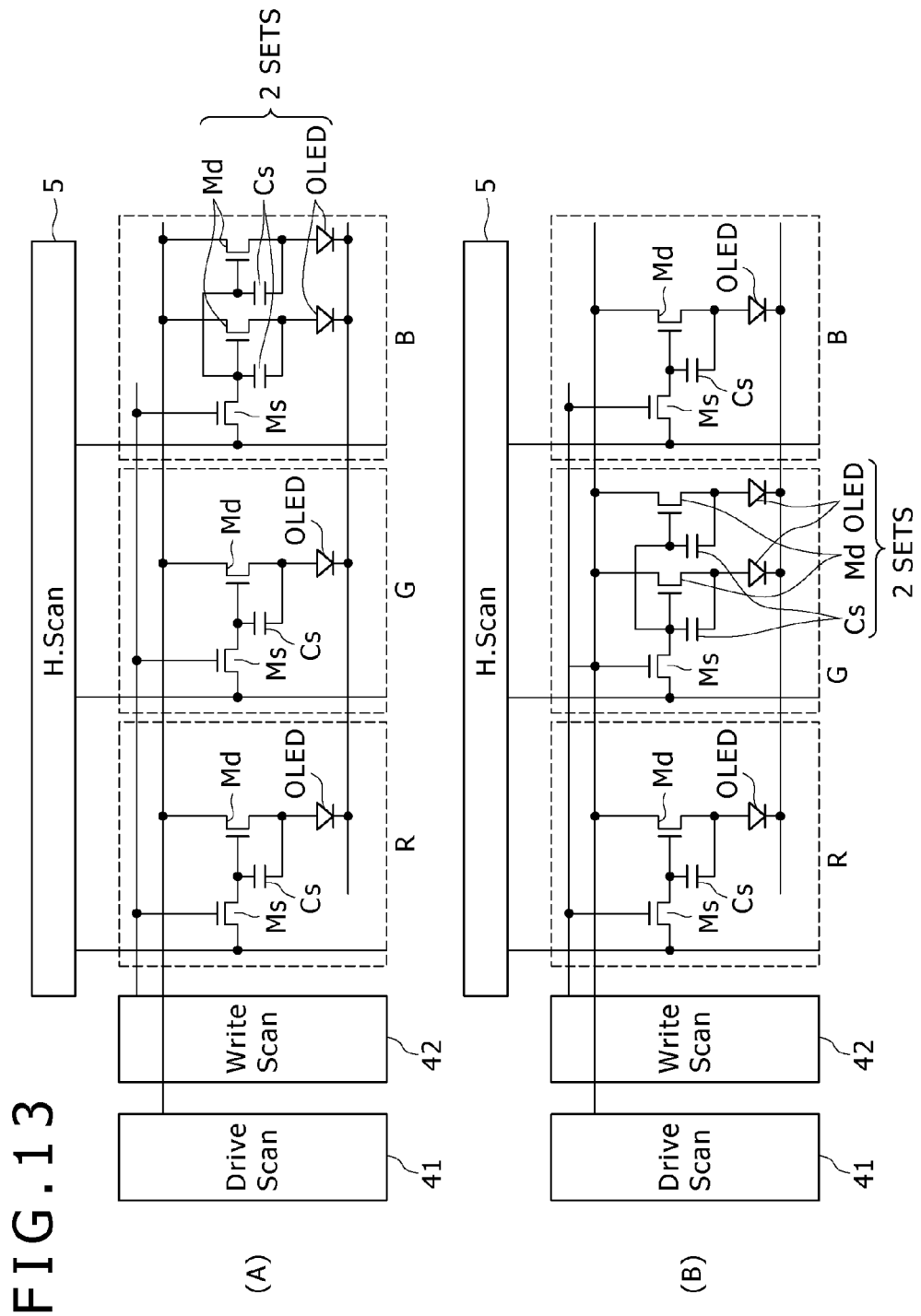
FIG. 13 is a diagram illustrating pixel unit configurations according to the embodiment of the present invention.

FIG. 13(A) is an equivalent circuit diagram of a pixel unit illustrating a case in which the blue (B) pixel with the smallest total thickness of the organic multi-layered film has a larger "set count" than other color pixels as an example of a "specific color pixel that is susceptible to a dark dot." On the other hand, FIG. 13(B) is an equivalent circuit diagram of a pixel unit illustrating a case in which the green (G) pixel has a larger "set" count than other color pixels as an example of a "specific color that has the highest relative luminosity factor."

Although the larger "set count" is two, this count need only be larger than the smaller "set count" of one and is an arbitrary number not less than 2.

It should be noted that although the "set" does not contain the sampling transistor Ms, the same transistor may be contained therein.

As an example of the case shown in FIG. 13(A), FIG. 14(A) illustrates main pixel circuit blocks, and FIG. 14(B) blocks on an overlying layer of the main pixel circuit blocks where the organic light-emitting diodes OLED are primarily arranged. As shown in these figures, all the pixel circuit elements (transistor, capacitor and organic light-emitting diode) need not be arranged in the same block. In the illustrated example, the blocks shown in FIG. 14(B) where the organic light-emitting diodes OLED are arranged are roughly identical in area for all colors of RGB. As for the blocks shown in FIG. 14(A) where the transistors and capacitors are arranged, the blue (B) pixel block with a "set count" of two is larger than that of each of other two colors.

As described above, arranging different element circuit elements in different blocks is advantageous in that it is easier to secure a space for arranging element circuit elements thanks to a larger "set count."

<Examples of Planar and Sectional Structures>

Here, a description will be given of a planar pattern and sectional structure of a pixel circuit with reference to the drawings. It should be noted that the red (R) pixel with a "set count" of one will be described here. Therefore, pixel circuit elements are laid out over the entire layout region for easier viewing of the drawings. However, if the "set count" must be increased, a layout space is secured, for example, by expanding the layout region.

Figure 15:
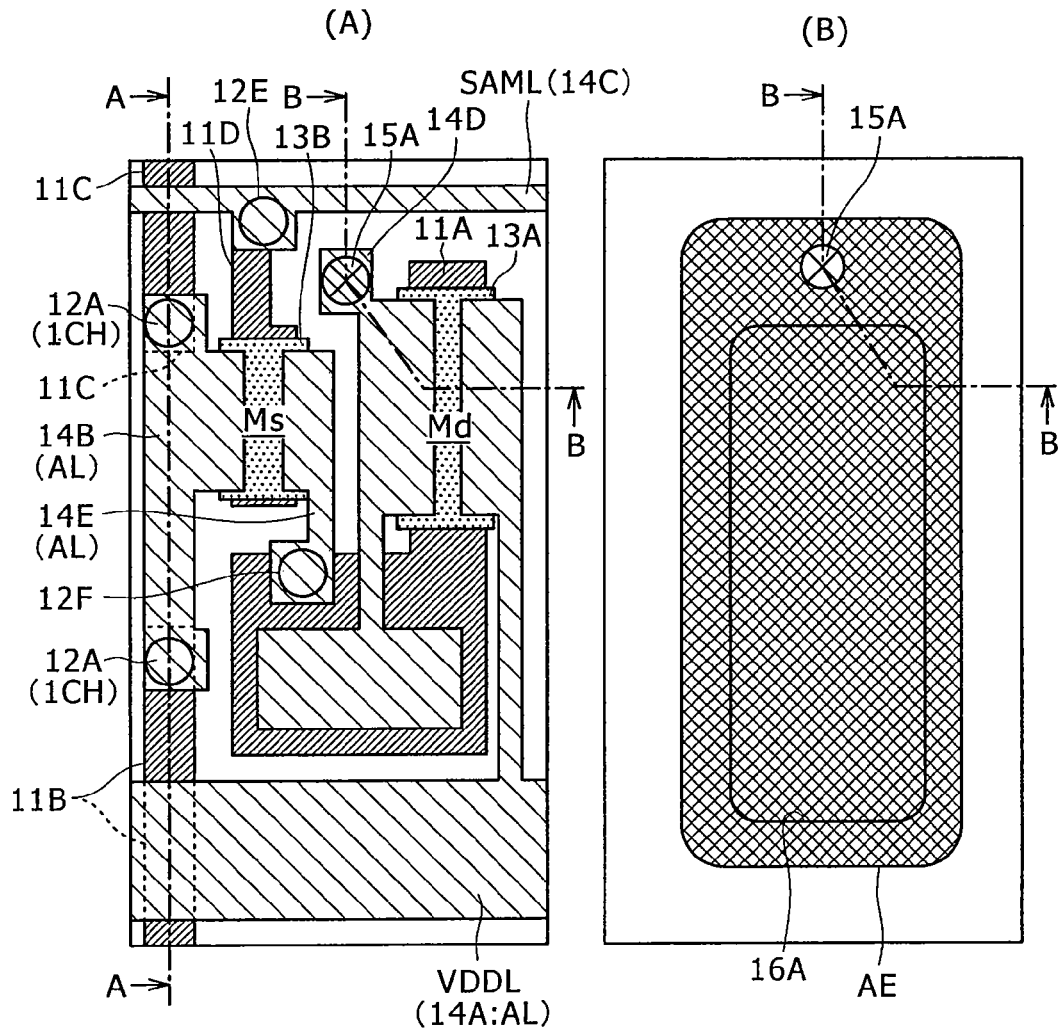
FIG. 15 is a plan view of a pixel circuit according to the embodiment of the present invention.

FIGS. 15(A) and 15(B) illustrate a planar pattern of the pixel circuit 3(i,j) in the ith row and jth column. FIG. 15(B) is a plan view with the cathode electrode on the uppermost layer (formed over the entire surface) omitted. FIG. 15(A) is a plan view midway during the manufacture with the electrodes and organic multi-layered film of the organic light-emitting diode OLED including the cathode electrode on the uppermost layer (formed over the entire surface) omitted.

FIG. 16(A) is a schematic sectional view taken on line A-A in FIG. 15(A). FIG. 16(B) is a schematic sectional view taken on line B-B in FIGS. 15(A) and 15(B).

In FIGS. 16(A) and 16(B), an underlying layer 10 (type of insulating layer) is formed directly on an unshown substrate made, for example, of glass or indirectly via other film.

In the sectional view shown in FIG. 16(B), a gate electrode 11A is formed on the underlying layer 10. The gate electrode 11A includes a given gate metal layer (GM) and contains a high-fusion-point metal such as molybdenum (Mo). The sectional view in FIG. 16(B) shows where the drive transistor Md illustrated, for example, in FIG. 5 is formed. As illustrated in FIG. 15(A), a gate electrode 11D, slightly different in size from the gate electrode 11A, is similarly formed where the sampling transistor Ms is formed.

In the sectional view shown in FIG. 16(A), on the other hand, two layers are formed on the underlying layer 10, namely, the first and second high-fusion-point metal wiring layers 11B and 11C which include the gate metal layer (GM) provided at the same hierarchical level and made of the same material as the gate electrode 11A. The first high-fusion-point metal wiring layer 11B and second high-fusion-point metal wiring layer 11C are spaced apart within the pixel but continuous between the adjacent pixels, as illustrated in FIG. 15(A). That is, the first high-fusion-point metal wiring layer 11B shown in FIG. 15(A) is connected to the second high-fusion-point metal wiring layer 11C (not shown) in the other unshown pixel which is continuous as a pattern on one side in the column direction (downward from FIG. 15(A)). Similarly, the second high-fusion-point metal wiring layer 11C shown in FIG. 15(A) is connected to the first high-fusion-point metal wiring layer 11B (not shown) in the other unshown pixel which is continuous as a pattern on the other side in the column direction (upward from FIG. 15(A)).

A gate insulating film 12 is formed over the entire surface of the underlying layer 10 to cover the surfaces of the gate electrode 11A (FIG. 16(B)) and the first and second high-fusion-point metal wiring layers 11B and 11C (FIG. 16(A)).

In the sectional view shown in FIG. 16(B), a TFT layer 13A of the drive transistor Md is formed on the gate insulating film 12. The TFT layer 13A is made, for example, of amorphous silicon (or polysilicon for P-channel TFT). As illustrated in FIG. 15(A), a TFT layer 13B of the sampling transistor Ms is formed similarly although different in size from the TFT layer 13A. The TFT layer 13A shown in FIG. 16(B) is doped with an impurity of opposite conductivity type, thus forming source (S) and drain (D) regions which are separated from each other. The same holds true for the TFT layer 13B.

In the sectional view shown in FIG. 16(A), a contact hole 12A is formed on the end portion of the first high-fusion-point metal wiring layer 11B in the gate insulating film 12. Similarly, a contact hole 12C is formed on the end portion of the second high-fusion-point metal wiring layer 11C in the gate insulating film 12.

A total of the two contact holes 12A and 12B or one hole for each of the wiring connection sections serve as first contact holes (1CH) adapted to connect together the high-fusion-point metal wiring layer and its overlying layer.

More specifically, the first high-fusion-point metal wiring layer 11B has its end portion connected to one of the end portions of an overlying wiring layer 14B via the contact hole 12A. The overlying wiring layer 14B is provided on the gate insulating film 12 and made, for example, of aluminum (AL). Further, the second high-fusion-point metal wiring layer 11C has its end portion connected to the other end portion of the overlying wiring layer 14B provided on the gate insulating film 12 via the contact hole 12C.

A supply line of the high potential Vcc_H (hereinafter referred to as the source voltage supply line VDDL) is provided above the first high-fusion-point metal wiring layer 11B. The source voltage supply line VDDL is insulated from the same layer 11B via the gate insulating film 12 and separated from the overlying wiring layer 14B by a pattern. The same line VDDL is connected to the horizontal pixel line drive circuit 41 shown in FIG. 5 and is designed to alternately apply the high potential Vcc_H and Low potential Vcc_L to the drain of the drive transistor Md. Therefore, a branch (denoted by the same reference symbol VDDL) of the source voltage supply line VDDL is in low-resistance electrical contact with the region which will serve as the drain (D) of the TFT layer 13A as illustrated in FIG. 15(A). On the other hand, an upper electrode layer 14D of the holding capacitor Cs is in electrical contact with the region which will serve as the source (S) of the drive transistor Md. The upper electrode layer 14D is provided at the same hierarchical level and made of the same material (aluminum AL) as the source voltage supply line VDDL. As illustrated in FIG. 15(A), the same layer 14D overlaps the lower electrode layer of the holding capacitor Cs which is continuous from the gate electrode 11A. This portion forms the holding capacitor Cs having a MIS (Metal-Insulator-Semiconductor) structure.

In FIG. 16(B), a control line SAML of the sampling transistor Ms is provided above the second high-fusion-point metal wiring layer 11C. The control line SAML is insulated from the same layer 11C via the gate insulating film 12 and separated from the overlying wiring layer 14B by a pattern. The same line SAML is connected to the write signal scan circuit 42 shown in FIG. 5 and is designed to apply the write drive pulse WS(i) to the gate of the sampling transistor Ms. As illustrated in FIG. 15(A), therefore, the control line SAML is connected to the gate electrode 11D of the sampling transistor Ms in the underlying layer via a contact hole 12E which is the first contact hole (1HC).

The control line SAML is disposed long in the row direction in parallel with the source voltage supply line VDDL. The video signal line DTL(j) has a structure in which the second high-fusion-point metal wiring layer 11C serves as a lower bridge at the intersection with the control line SAML (referred to as the lower bridge structure in the present specification). Similarly, the video signal line DTL(j) has a structure in which the first high-fusion-point metal wiring layer 11B serves as a lower bridge at the intersection with the source voltage supply line VDDL (lower bridge structure).

It should be noted that the overlying wiring layer 14B is connected, on the pattern, to the drain side of the TFT layer 13B of the sampling transistor Ms and that an in-cell wiring 14E, made of aluminum (AL) and making up part of the control node NDc of the drive transistor Md shown in FIG. 5, is connected to the source side thereof. The in-cell wiring 14E is electrically connected to the lower electrode layer of the holding capacitor Cs in the underlying layer via a contact hole 12F which is the first contact hole (1HC).

A planarizing film 15 is formed over the entire surface to bury the aluminum (AL) wirings formed as described above, i.e., the source voltage supply line VDDL, control line SAML, overlying wiring layer 14B, upper electrode layer 14D and in-cell wiring 14E and planarize the surface by removing the level differences therebetween (refer to FIG. 16(B)).

As shown in the sectional view in FIG. 16(B), an anode contact 15A is formed in a portion of the planarizing film 15 on the upper electrode layer 14D by filling a second contact hole (2HC), formed in the planarizing film 15, with a conductive material.

Then, an anode electrode (AE), a protective film 16, an organic multi-layered film (OML) and a cathode electrode (CE) are deposited in this order, thus forming the organic light-emitting diode OLED. The anode electrode (AE) is formed on the planarizing film 15 and in contact with the end surface of the anode contact 15A. The protective film 16 is formed on the anode electrode (AE) and has an opening portion 16A one size smaller than the anode electrode (AE). The organic multi-layered film (OML) covers the protective film 16. The cathode electrode (CE) is formed in the form of a blanket over the entire surface of the area occupied by the pixel.

In the above embodiment, a plurality of sets of the drive transistor, holding capacitor and organic light-emitting diode are provided only for the color pixel that is the most susceptible to a dark dot or that has the highest relative luminosity factor in each of the pixel units, thus preventing a dark dot in the subpixel susceptible to a dark dot or ensuring that a dark dot is inconspicuous. This provides improved yield.

On the other hand, all the pixel circuit elements (transistor, capacitor and organic light-emitting diode) of each set are not arranged in the same block (on the same layer). Instead, the ratio of area between the pixels with different set counts is, for example, smaller on the layer where the organic light-emitting diodes are formed than on the layer where other pixel circuit elements are formed so as to ensure the best layout efficiency. This contributes to improved layout efficiency and provides appropriate wiring lines and spaces, thus preventing reduced yield caused by a short circuit between lines.

The invention claimed is:

1. A display device comprising a pixel array section, the pixel array section including:
    a plurality of pixel units;
    a plurality of signal lines arranged in a first direction; and
    a plurality of scanning lines arranged in a second direction substantially perpendicular to the first direction,
    wherein,
        each of the pixel units comprises a plurality of pixels,
        each pixel of the plurality of pixels includes at least one pixel circuit element set, each pixel circuit element set comprising (i) circuit elements including a holding capacitor and a drive transistor and (ii) a light-emitting element,
        each holding capacitor is adapted to store data corresponding to image data given a voltage signal from one of the signal lines, and
        each drive transistor is adapted to control a drive current in response to the data stored in the respective holding capacitor, and
        each light-emitting element is adapted to emit light based on the drive current controlled by the respective drive transistor, and
        in each of the plurality of pixel units,
            (a) a pixel corresponding to a specific color has more pixel circuit element sets than any pixel corresponding to one of other colors,
            (b) opening areas of the light-emitting elements in the pixel corresponding to the specific color are adjacent to each other, along the first direction,
            (c) an opening area of the light-emitting element in at least one of the pixels corresponding to at least one of the other colors is adjacent to one of the opening areas of the light-emitting elements in the pixel corresponding to the specific color, along the second direction, and
            (d) an area of the light-emitting element corresponding to one of the other colors partially overlies an area of a pixel circuit block for the circuit elements corresponding to the specific color.

2. The display device according to claim 1, wherein for at least each of the pixel circuit element sets corresponding to the specific color, a control node of the drive transistor is made of a material including molybdenum, and a wiring between the light-emitting element and the drive transistor comprises a material including aluminum.

3. The display device according to claim 1, wherein each of the pixel circuit element sets is a multi-layered structure on a substrate, the multi-layered structure comprising a first layer including a control node of the drive transistor and a second layer including a wiring between the light-emitting element and the drive transistor, the first layer being between the substrate and the second layer.

4. The display device of claim 1, wherein the specific color is a color that is susceptible to a dark dot or that has a highest relative luminosity factor.

5. The display device of claim 4, wherein:
each light-emitting element has a multi-layered film structure comprising (a) one of an anode and cathode, (b) a plurality of organic thin films of materials and thicknesses suitable for emitting light of an intended color, and (c) the other of the anode and cathode, and
a total thickness of the plurality of organic thin films in the specific color pixel that is susceptible to a dark dot is smaller than a total thickness of the organic thin films of each of the pixels corresponding to the other colors.

6. The display device of claim 1, wherein for each of the pixel units, all of the pixel circuit element sets in the pixel corresponding to the specific color is commonly connected to one of the signal lines.

7. The display device of claim 6, wherein:
each of the pixels includes a sampling transistor adapted to sample the image signal from one of the signal lines to the holding capacitor, and
for each pixel corresponding to the specific color, a single sampling transistor is shared with the pixel circuit element sets.

8. The display device of claim 1, wherein:
in each pixel unit, the drive transistors have a same channel conductivity type and size, and
in each pixel unit, the holding capacitors have a same capacitance,
in each pixel unit, drive current paths for the plurality of light-emitting elements are connected in parallel to a drive voltage supply terminal.

9. The display device of claim 1, wherein in each of the pixel units, an opening area of one of the light-emitting elements corresponding to the specific color is smaller than an opening area of one of the light-emitting elements corresponding to one of the other colors.

10. The display device of claim 9, wherein in each of the pixel units, opening areas of the light-emitting elements corresponding to the specific color are substantially a same size and are smallest among opening areas of the light-emitting elements corresponding to the other colors.

11. The display device of claim 1, wherein in each of the pixel units, a total area of opening areas of the light-emitting elements corresponding to the specific color is approximately equal to an opening area of one of the light-emitting elements corresponding to one of the other colors.

12. The display device of claim 1, wherein in each of the pixel units, a total area of openings of the light-emitting elements corresponding to the specific color is approximately equal to an opening area of any one of the light-emitting elements corresponding to any one of the other colors.

13. The display device of claim 1, wherein in each of the pixel units, an opening area per pixel is approximately a same size.

14. The display device of claim 1, wherein in each of the pixel units, a total area of openings of the light-emitting elements, provided as many as the number of pixel circuit element sets in the specific color pixel, is approximately equal to the opening area per pixel of the other color pixels.

15. The display device of claim 1, wherein each of the plurality of pixel units comprises at least four pixels respectively corresponding to R (red), G (green), B (blue), and W (white).

16. The display device of claim 1, wherein:
the light-emitting elements include a white light-emitting organic material, and
color distinction for each of the plurality of pixels is provided by color filters.

17. The display device of claim 1, wherein the plurality of pixel units are regularly arranged along the first direction and the second direction as a matrix form.

18. The display device of claim 1, wherein:
the pixel corresponding to the specific color is a green pixel, and
the pixels corresponding to the other colors include a red pixel and a blue pixel.

19. The display device according to claim 1, wherein the area of the pixel circuit block of the circuit elements for the specific color at least partially overlaps with an opening area of the light-emitting element in at least one of the pixels corresponding to at least one of the other colors.

20. The display device of claim 1, wherein the area of a pixel circuit block for the circuit elements of the pixel corresponding to the specific color is larger than a respective area of each of pixel circuit blocks for circuit elements of each of at least two pixels corresponding to the other colors.

21. A display device comprising a pixel array section including a plurality of pixel units, wherein:
each of the pixel units comprises at least three pixels,
each of the pixels includes at least one pixel circuit element set, each pixel circuit element set having (i) circuit elements including a holding capacitor and a drive transistor and (ii) a light-emitting element adapted to emit light according to data given as a voltage signal to the pixel circuit element set, and
in each of the pixel units,
(a) a pixel corresponding to a specific color has more pixel circuit element sets than any pixel corresponding to one of other colors,
(b) opening areas of the light-emitting elements in the pixel corresponding to the specific color are adjacent to each other, along a first direction,
(c) an opening area of the light-emitting element in at least one of the pixels corresponding to at least one of the other colors is adjacent to one of the opening areas of one of the light-emitting elements in the pixel corresponding to the specific color along a second direction, the second direction being different from the first direction, and
(d) an area of the light-emitting element corresponding to one of the other colors partially overlies an area of a pixel circuit block for the circuit elements corresponding to the specific color.

22. The display device according to claim 21, wherein the area of the pixel circuit block of the circuit elements for the specific color at least partially overlaps with an opening area of the light-emitting element in at least one of the pixels corresponding to at least one of the other colors.

* * * * *